US012775204B2

(12) United States Patent
Li et al.

(10) Patent No.: US 12,775,204 B2
(45) Date of Patent: Oct. 27, 2026

(54) LIGHT SOURCE AND LASER PROJECTION DEVICE

(71) Applicant: HISENSE LASER DISPLAY CO., LTD., Shandong (CN)

(72) Inventors: Wei Li, Shandong (CN); Youliang Tian, Shandong (CN); Xianrong Liu, Shandong (CN); Ke Yan, Shandong (CN)

(73) Assignee: HISENSE LASER DISPLAY CO., LTD., Qingdao (CN)

( * ) Notice: Subject to any disclaimer, the term of this patent is extended or adjusted under 35 U.S.C. 154(b) by 321 days.

(21) Appl. No.: 18/674,525

(22) Filed: May 24, 2024

(65) Prior Publication Data

US 2024/0313510 A1 Sep. 19, 2024

Related U.S. Application Data

(63) Continuation of application No. PCT/CN2022/102978, filed on Jun. 30, 2022.

(30) Foreign Application Priority Data

Dec. 8, 2021 (CN) .......................... 202111491181.9
Dec. 31, 2021 (CN) .......................... 202111662936.7
Dec. 31, 2021 (CN) .......................... 202111662949.4

(51) Int. Cl.
*G03B 21/20* (2006.01)
*G02B 27/09* (2006.01)
(Continued)

(52) U.S. Cl.
CPC ....... *G03B 21/208* (2013.01); *G02B 27/0966* (2013.01); *G02B 27/0994* (2013.01);
(Continued)

(58) Field of Classification Search
CPC . H01S 5/4012; H01S 5/4087; G02B 27/0966; G02B 27/0994; G02B 27/141;
(Continued)

(56) References Cited

U.S. PATENT DOCUMENTS

2013/0243019 A1 9/2013 Wakabayashi et al.
2016/0198135 A1* 7/2016 Kita .......................... F21V 9/08 348/756

(Continued)

FOREIGN PATENT DOCUMENTS

CN 103163648 A 6/2013
CN 103311806 A 9/2013

(Continued)

OTHER PUBLICATIONS

US 8,764,199 B2, 07/2014, Miura (withdrawn)

(Continued)

*Primary Examiner* — Magda Cruz
(74) *Attorney, Agent, or Firm* — Knobbe, Martens, Olson & Bear, LLP

(57) ABSTRACT

A light source and a laser projection device are provided. The light source includes a laser array, a light combining mirror group, and a light spot shaping component. The laser array includes a first row of laser chips and a second row of laser chips. The first row of laser chips includes at least one first-color laser chip and at least one second-color laser chip, and the second row of laser chips includes at least two red laser chips. The light combining mirror group is configured to combine laser beams emitted by the laser array. The light spot shaping component is configured to receive and adjust a light beam coming from the light combining mirror group to increase the difference between the length of a light spot of the light beam in a long side direction and the length thereof in a short side direction.

20 Claims, 16 Drawing Sheets

(51) Int. Cl.

| | |
|---|---|
| ***G02B 27/14*** | (2006.01) |
| ***G02B 27/28*** | (2006.01) |
| ***H01S 5/40*** | (2006.01) |

(52) U.S. Cl.
CPC ......... *G02B 27/141* (2013.01); *G02B 27/286* (2013.01); *G03B 21/2013* (2013.01); *G03B 21/2033* (2013.01); *H01S 5/4087* (2013.01); *H01S 5/4012* (2013.01)

(58) Field of Classification Search
CPC .............. G02B 27/286; G03B 21/2013; G03B 21/2033; G03B 21/208; G03B 21/14; G03B 21/20; G03B 21/2066
USPC ............................................................ 353/94
See application file for complete search history.

(56) References Cited

U.S. PATENT DOCUMENTS

| | | | | |
|---|---|---|---|---|
| 2016/0241819 | A1 | 8/2016 | Chien | |
| 2020/0333698 | A1 | 10/2020 | Pan et al. | |
| 2021/0191138 | A1 | 6/2021 | Zhai | |
| 2023/0020534 | A1* | 1/2023 | Li | G03B 21/2013 |
| 2023/0198219 | A1* | 6/2023 | Li | G02B 27/30 372/44.01 |

FOREIGN PATENT DOCUMENTS

| | | | |
|---|---|---|---|
| CN | 106125482 | A | 11/2016 |
| CN | 107505797 | A | 12/2017 |
| CN | 207352292 | U | 5/2018 |
| CN | 109560461 | A | 4/2019 |
| CN | 111258165 | A | 6/2020 |
| CN | 111404019 | A | 7/2020 |
| CN | 113031292 | A | 6/2021 |
| CN | 113156698 | A | 7/2021 |
| CN | 113534588 | A | 10/2021 |
| CN | 214375786 | U | 10/2021 |
| CN | 113641067 | A | 11/2021 |
| CN | 113777869 | A | 12/2021 |
| CN | 114236957 | A | 3/2022 |
| CN | 114609854 | A | 6/2022 |

OTHER PUBLICATIONS

International search report of PCT application No. PCT/CN2022/103190 issued on Sep. 5, 2022.
International search report of PCT application No. PCT/CN2022/102978 issued on Oct. 25, 2022.
China National Intellectual Property Administration, First office action of Chinese application No. 202111320370.X issued on Apr. 30, 2025.

* cited by examiner

LIGHT SOURCE AND LASER PROJECTION DEVICE

CROSS-REFERENCE TO RELATED APPLICATIONS

The present application is a continuation application of International Application No. PCT/CN2022/102978, filed on Jun. 30, 2022, which claims priority to Chinese Patent Application No. 202111491181.9, filed on Dec. 8, 2021, Chinese Patent Application No. 202111662949.4, filed on Dec. 31, 2021, and Chinese Patent Application No. 202111662936.7, filed on Dec. 31, 2021, the contents of all of which are incorporated herein by reference in their entirety.

TECHNICAL FIELD

The present disclosure relates to the field of projection display, in particular to a light source and a laser projection device.

BACKGROUND OF THE INVENTION

At present, the laser projection display technology is a new projection display technology on the market. Compared with light-emitting diode (LED) projection products, the laser projection display technology has the characteristics of clearer image, brighter color and higher brightness, and these obvious characteristics make the laser projection display technology become a mainstream development direction on the market.

SUMMARY OF THE INVENTION

In one aspect, some embodiments of the present disclosure provide a light source including: a laser array, a light combining mirror group and a light spot shaping component. The laser array includes a first row of laser chips and a second row of laser chips, wherein the first row of laser chips includes at least one first-color laser chip and at least one second-color laser chip, and the second row of laser chips includes at least two red laser chips. The light combining mirror group is configured to combine laser beams emitted by the laser array. The light spot shaping component is configured to receive and adjust a light beam coming from the light combining mirror group, so that a difference between the length of a light spot of a light beam exiting the light spot shaping component in a long side direction and the length thereof in a short side direction is less than a difference between the length of a light spot of a light beam incident to the light spot shaping component in a long side direction and the length thereof in a short side direction.

In another aspect, some embodiments of the present disclosure provide a laser projection device including a light source, an light modulating component and a lens. The light source is the above light source and configured to emit a laser beam. The light modulating component is configured to modulate a light beam incident to the light modulating component according to an image signal to acquire a projection beam. The lens is configured to project a light beam incident to the lens to form a projection picture.

DETAILED DESCRIPTION

The technical solutions in some embodiments of the present disclosure will be clearly and completely described below in conjunction with the accompanying drawings. It is obvious that the described embodiments are only part but not all of the embodiments of the present disclosure. All other embodiments obtained by those ordinary skilled in the art based on the embodiments according to the present disclosure are within the protection scope of the present disclosure.

Figure 1:
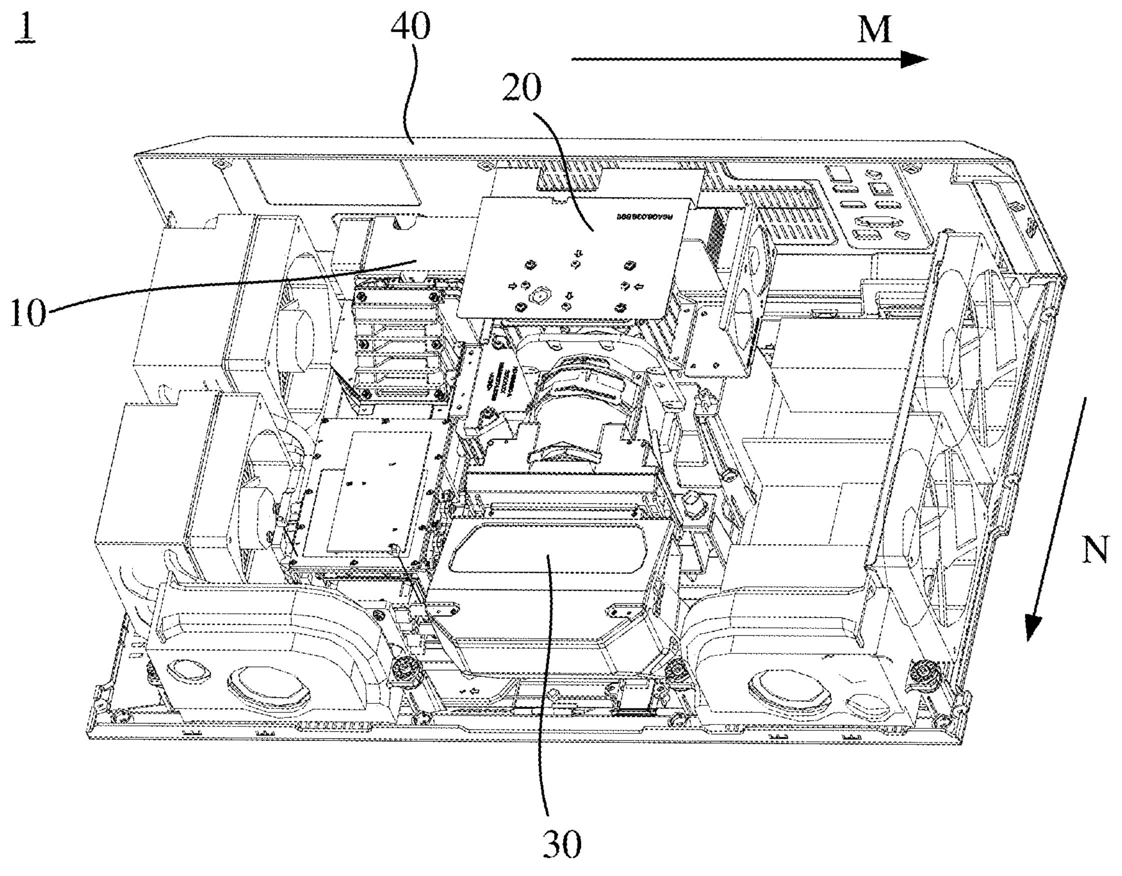
FIG. 1 is a structural diagram of a laser projection device according to some embodiments.

FIG. 1 is a structural diagram of a laser projection device according to some embodiments. Referring to FIG. 1, a laser projection device 1 includes a light source 10, an light modulating component 20 and a lens 30. The laser projection device 1 may further include a housing 40 (only a part of the housing 40 is shown in FIG. 1).

The light source 10 is configured to provide an illumination beam (laser beam). The light modulating component 20 is configured to modulate the illumination beam provided by the light source 10 with an image signal to acquire a projection beam. The lens 30 is configured to project the projection beam on a screen or a wall to form a projection picture. The light source 10, the light modulating component 20 and the lens 30 may be assembled in the housing 40. The light source 10, the light modulating component 20 and the lens 30 may be connected in sequence along a propagation direction of the light beam.

The light source 10, the light modulating component 20 and the lens 30 may be respectively wrapped by corresponding housings. The respective corresponding housings of the light source 10, the light modulating component 20 and the lens 30 may support the corresponding optical components and enable respective optical components to meet certain scaling or airtight requirements. Exemplarily, the light source 10 is hermetically sealed by its corresponding housing, so that the problem of light attenuation of the light source 10 can be improved.

One end of the light modulating component 20 is connected with the lens 30, and the light modulating component 20 and the lens 30 are disposed along an exit direction of the projection beam of the laser projection device 1 (e.g., parallel to an N direction). The other end of the light modulating component 20 may be connected with the light source 10.

In some embodiments, an arrangement direction of the light source 10 and the light modulating component 20 is substantially perpendicular to an arrangement direction of the light modulating component 20 and the lens 30, that is, in the laser projection device 1, the exit direction of the projection beam (e.g., parallel to the N direction) is substantially perpendicular to the exit direction of the illumination beam (e.g., parallel to an M direction). On one hand, such a connection structure can adapt to light path characteristics of a reflective light valve (which will be described below) in the light modulating component 20, and on the other hand, it is beneficial to shorten a length of the light path in one direction, so that there is more space for arranging respective components of the laser projection device 1.

Figure 2:
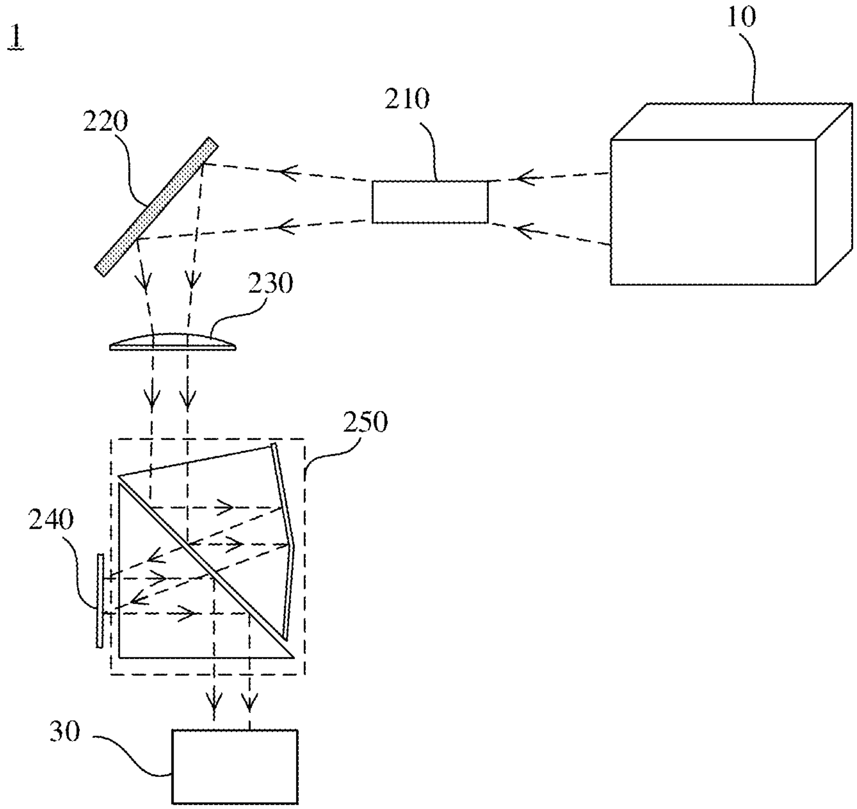
FIG. 2 is a structural diagram of a light source, an light modulating component and a lens in a laser projection device according to some embodiments.

FIG. 2 is a structural diagram of a light source, an light modulating component and a lens in a laser projection device according to some embodiments. Referring to FIG. 2, the illumination beam emitted by the light source 10 enters the light modulating component 20. The light modulating component 20 includes a first light homogenizing component 210, a reflective mirror 220, a lens 230, a light valve 240 and a prism assembly 250. The light valve 240 is configured to modulate the illumination beam incident thereto into a projection beam according to an image signal, and emit the projection beam to the lens 30. The first light homogenizing component 210 and the light valve 240 are sequentially disposed along a propagation direction of the light beam. The first light homogenizing component 210 is configured to homogenize the illumination beam incident thereto and then emit to the light valve 240.

In some embodiments, the first light homogenizing component 210 is a light pipe. The light pipe receives the illumination beam provided by the light source 10 and homogenizes the illumination beam. In some embodiments, a light outlet of the light pipe is rectangular. The light pipe can shape a light spot of the light beam, so that the shape of the light spot of the light beam matches the shape of the light valve 240.

The light valve 240 may be a reflective light valve. The light valve 240 includes a plurality of reflective sheets, and each reflective sheet corresponds to one pixel in the projection picture. Exemplarily, according to the projection picture to be displayed, the reflective sheets corresponding to the pixels to be displayed in a bright state in the plurality of reflective sheets of the light valve 240 may reflect the light beam to the lens 30, and the light beam reflected to the lens 30 is called the projection beam. In this way, the light valve 240 can modulate the illumination beam to acquire the projection beam, and display the picture through the projection beam.

In some embodiments, the light valve 240 is a digital micromirror device (DMD). The DMD includes a plurality (e.g., thousands) of micro-reflective mirror plates which can be individually driven to rotate. The plurality of micro-reflective mirror plates may be arranged in an array. One micro-reflective mirror plate (e.g., each micro-reflective mirror plate) corresponds to one pixel in the projected picture to be displayed.

After processing, the image signal may be converted into digital codes such as 0 and 1, and in response to these digital codes, the micro-reflective mirror plate may swing. Respective durations of each micro-reflective mirror plate in an open state and a closed state are controlled to realize a gray scale of each pixel in a frame image. In this way, the DMD can modulate the illumination beam, and then realize the display of the projection picture.

With continued reference to FIG. 2, in some embodiments, the laser projection device 1 may further include an illumination lens group disposed between the light valve 240 and the first light homogenizing component 210, and the illumination lens group includes the reflective mirror 220, the lens 230 and the prism assembly 250. The light beam homogenized by the first light homogenizing component 210 may be emitted towards to the light valve 240 through the illumination lens group.

The illumination beam exiting the first light homogenizing component 210 is emitted to the reflective mirror 220, and the reflective mirror 220 reflects the illumination beam emitted thereto to the convex lens 230. The convex lens 230 converges the illumination beam incident thereto to the prism assembly 250, and the prism assembly 250 reflects the illumination beam incident thereto to the light valve 240.

Some embodiments of the present disclosure also provide a light source. The light source may be the light source of any one of the above laser projection devices. Of course, the light source may also be a light source in other devices, which is not limited by the embodiment of the present disclosure.

Figure 3:
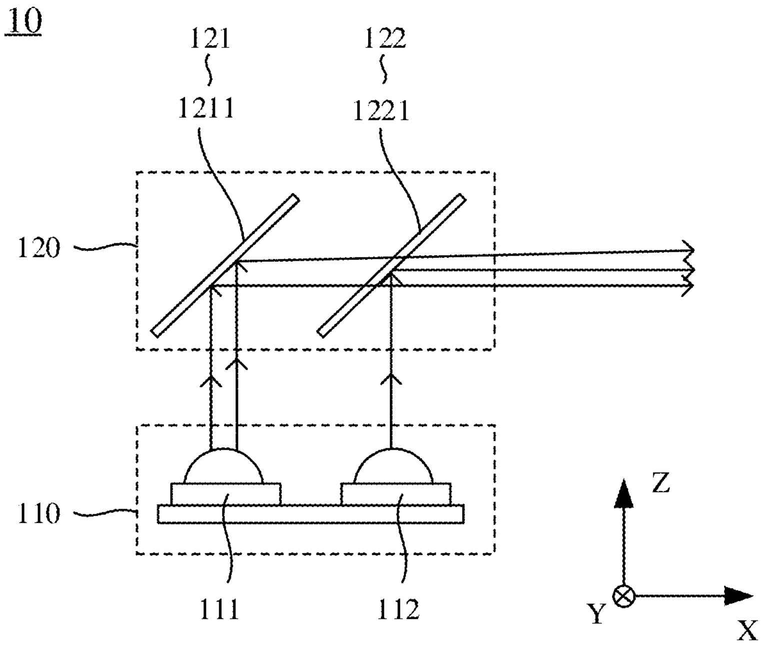
FIG. 3 is a structural diagram of a light source according to some embodiments.
Figure 4:
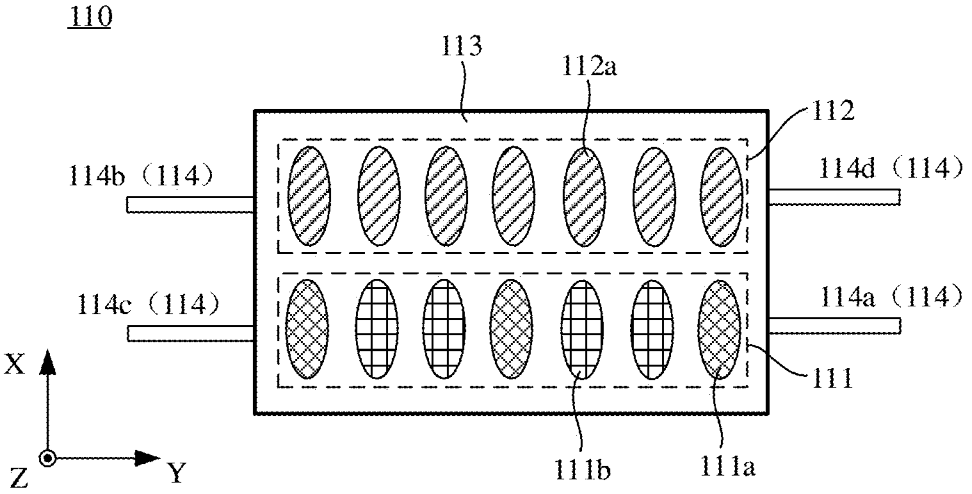
FIG. 4 is a top view of a laser array in the light source shown in FIG. 3.

FIG. 3 is a structural diagram of a light source according to some embodiments. FIG. 4 is a top view of a laser array in the light source shown in FIG. 3. Referring to FIG. 3 and FIG. 4, the light source 10 includes a laser array 110 and a light combining mirror group 120. The laser array 110 includes a plurality of laser chips. In the laser array 110, the plurality of (e.g., all) laser chips may be distributed in an array.

The plurality of laser chips form a first row of laser chips 111 and a second row of laser chips 112. In other words, the laser array 110 includes a first row of laser chips 111 and a second row of laser chips 112. In FIG. 3 and FIG. 4, the direction in which the first row of laser chips 111 points to the second row of laser chips 112 is taken as a first direction X, an arrangement direction of each laser chip in the first row of laser chips 111 is taken as a second direction Y, and a light exit direction of each laser chip is taken as a third direction Z.

A row direction of the first row of laser chips 111 and a row direction of the second row of laser chips 112 are parallel, and are both parallel to a row direction of the laser chip array (e.g., the second direction Y). An arrangement direction of the first row of laser chips 111 and the second row of laser chips 112 is parallel to a column direction of the laser chip array (e.g., the first direction X).

The first row of laser chips 111 includes at least one first-color laser chip 111*a* and at least one second-color laser chip 111*b*. The second row of laser chips 112 includes at least two red laser chips 112*a*.

It should be noted that in FIG. 4, a position of the laser chip is identified by a light spot emitted by the laser chip. For example, in FIG. 4, the position of the first-color laser chip 111*a* is identified by the light spot emitted by the first-color laser chip 111*a*, the position of the second-color laser chip 111*b* is identified by the light spot emitted by the second-color laser chip 111*b*, and the position of the red laser chip 112*a* is identified by the light spot emitted by the red laser chip 112*a*.

The red laser chip 112*a* is configured to emit a red laser beam. The first-color laser chip 111*a* is configured to emit a first color laser beam, the second-color laser chip 111*b* is configured to emit a second color laser beam, and the first color laser beam and the second color laser beam are different in color. In some embodiments, one of the first-color laser chip 111*a* and the second-color laser chip 111*b* is a blue laser chip configured to emit a blue laser beam, and the other is a green laser chip configured to emit a green laser beam.

In the light source according to some embodiments of the present disclosure, the first row of laser chips 111 includes at least one first-color laser chip 111*a* and at least one second-color laser chip 111*b*, and the second row of laser chips 112 includes at least two red laser chips 112*a*. Therefore, a quantity of the red laser chips 112*a* may be greater than a quantity of the first-color laser chips 111*a* or a quantity of the second-color laser chips 111*b*. In some embodiments, the first row of laser chips 111 does not include the red laser chip 112*a*, and the second row of laser chips 112 does not include the first-color laser chip 111*a* and the second-color laser chip 111*b*. In some embodiments, the quantity of the laser chips in the first row of laser chips 111 is the same the quantity of the laser chips in the second row of laser chips 112, that is, the quantity of the red laser chips 112*a* is a sum of the quantity of the first-color laser chips 111*a* and the quantity of the second-color laser chips 111*b*. Exemplarily, the first row of laser chips 111 and the second row of laser chips 112 in the laser array 110 both include seven laser chips.

In a light transmission process, the red laser beam is more divergent than the blue laser beam and the green laser beam. Therefore, a light loss rate of the red laser beam is greater than a light loss rate of the blue laser beam and a light loss rate of the green laser beam. In this way, when the laser projection device projects an image, in order to achieve a predetermined white balance, more red laser components are required. Based on this, in the light source according to some embodiments, the quantity of the red laser chips is greater than the quantity of the blue laser chips or the quantity of the green laser chips, thereby providing more red laser beams.

In the light source according to some embodiments of the present disclosure, the number of red laser chips 112*a* in the second row of laser chips 112 can be less than the number of laser chips in the first row of laser chips 111, and the number of red laser chips 112*a* in the second row of laser chips 112 can be greater than each of the number of first-color laser chips 111*a* and the number of second-color laser chips 111*b*.

As mentioned above, in the same light path, the red laser beam is more divergent than other color laser beams. Therefore, in order to acquire a less divergent red laser beam, in some embodiments, the first row of laser chips 111 and the second row of laser chips 112 are arranged in sequence along a direction of the light beam coming from the light combining mirror group 120 (e.g., the first direction X). In this way, compared with the first color laser beam and the second color laser beam, the red laser beam can have a shorter light path, thereby reducing the divergence of the red laser beam. It should be noted that the first row of laser chips 111 and the second row of laser chips 112 may also be arranged in other directions, which is not limited by the present disclosure.

Referring to FIG. 3, the light combining mirror group 120 is configured to combine the laser beams emitted by the laser array 110.

The light combining mirror group 120 is disposed on a light exit side of the laser array 110. Exemplarily, an arrangement direction of the light combining mirror group 120 and the laser array 110 is substantially perpendicular to the direction of a light beam coming from the light combining mirror group 120.

Referring to FIG. 3 and FIG. 4, the laser array 110 in the light source 10 according to some embodiments of the present disclosure includes two rows of laser chips, and the length of the laser array 110 may be smaller in the arrangement direction (e.g., the first direction X) of these two rows of laser chips. In this way, the laser array 110 is easier to install. In addition, more space can be reserved around the laser array 110 to dispose other structures in the light source 10. Exemplarily, structures such as a radiator, a fan or a circuit board may be disposed in the space, so that installation positions of these structures are more flexible. In addition, since the length of the light source according to some embodiments of the present disclosure is smaller in the arrangement direction of the two rows of laser chips, the overall volume of the laser projection device including the light source can be reduced, which is beneficial for miniaturization of the laser projection device.

In addition, if the laser chips emitting the laser beams of different colors are disposed in different rows, in order to combine the laser beams of different colors, the light combining mirror group in the light source needs to combine the laser beams emitted by at least three rows of laser chips. In contrast, referring to FIG. 4, in the light source according to some embodiments of the present disclosure, the first-color laser chips 111*a* and the second-color laser chips 111*b* are disposed in the same row, and the light combining mirror group may combine the laser beams emitted by the two rows of laser chips. In this way, the light path in the light source according to some embodiments of the present disclosure can be simpler and the length of the light source can also be smaller.

In some embodiments, the laser array 110 is a multi-chip laser diode (MCL) assembly, that is, a plurality of laser chips are packaged on one substrate to form a surface light source output. Exemplarily, the laser array 110 includes a substrate 113 on which the first row of laser chips 111 and the second row of laser chips 112 are packaged. Laser chips having the same color in these two rows of laser chips can be connected in series, driven in parallel in rows or columns, or driven in parallel in different colors.

Referring to FIG. 4, in some embodiments, the laser array 110 includes a plurality of pins 114. The plurality of pins 114 are disposed at the side edge of the substrate 113 parallel to the column direction of the laser chip array. These pins are electrically connected with the circuit board in the light source 10, and through these pins, electrical signals may be written into one or more laser chips, thereby driving the one or more laser chips to emit the laser beams.

Exemplarily, the laser array 110 includes a positive electrode pin 114*a* and three negative electrode pins 114*b* to 114*d*. The plurality of (e.g., all) red laser chips 112*a*, the plurality of (e.g., all) first-color laser chips 111*a* (e.g., blue laser chips) and the plurality of (e.g., all) second-color laser chips 111*b* (e.g., green laser chips) share one positive electrode pin 114*a*. Furthermore, the plurality of (e.g., all) red laser chips 112*a* correspond to one negative electrode pin, the plurality of (e.g., all) first-color laser chips 111*a* correspond to another negative electrode pin, and the plurality of (e.g., all) second-color laser chips 111*b* correspond to yet another negative electrode pin. In this way, compared with the laser chips of each color provided with the corresponding positive electrode pin and negative electrode pin, the quantity of the pins in the laser array in some embodiments of the present disclosure is less, which can simplify a manufacturing process of the laser array and reduce a manufacturing cost of the laser array.

Referring to FIG. 4, the shape of the light spot emitted by one laser chip (e.g., each laser chip) in the laser array 110 may be a flat and long shape, such as an ellipse, rectangle, near ellipse, or near rectangle. In an example where the shape of the light spot is an ellipse, a fast axis direction of the laser chip may be parallel to a long axis of the ellipse, and a slow axis direction of the laser chip may be parallel to a short axis of the ellipse. Exemplarily, the fast axis direction of the laser chip is parallel to the first direction X, and the slow axis direction of the laser chip is parallel to the second direction Y. Generally, a divergence angle of the fast axis is greater than a divergence angle of the slow axis. For example, for some laser chips, the divergence angle of the fast axis is more than three times that of the slow axis. Therefore, the light spot formed by the laser chip is approximately elliptical, but not limited thereto.

Based on this, referring to FIG. 4, in some embodiments, the arrangement direction of the first row of laser chips 111 and the second row of laser chips 112 in the laser array 110 is parallel to the fast axis direction of one laser chip (e.g., each laser chip). Correspondingly, the row directions of the first row of laser chips 111 and the second row of laser chips 112 are parallel to the slow axis direction of one laser chip. In this way, on the premise that the quantity of the laser chips included in the laser array 110 is the same and the light spots of the light beams emitted by respective laser chips do not overlap, the difference between the length in the row direction and the length in the column direction of the laser array 110 can be reduced.

In some embodiments, the first-color laser chips 111*a* are the blue laser chips and the second-color laser chips 111*b* are the green laser chips. In addition, in one end of the first row of laser chips 111 in the row direction, the laser chip disposed at the outermost side is a blue laser chip. Exemplarily, the first row of laser chips 111 has at least one first-color laser chip 111*a* at at least one of two edges in the row direction thereof. Since the laser beams emitted by the laser chips are diverged in the propagation process, and an optical lens in the light source has a certain angle range of receiving the light beams, the loss of the laser beams emitted by one or more laser chips disposed at the edges of the first row of laser chips 111 is larger. Since the luminous efficiency of the blue laser chip is higher than that of the green laser chip, when the blue laser chip is disposed at the edge of the first row of laser chips 111, the whole luminous efficiency of the laser array 110 can be higher.

In some embodiments, the quantity of the second-color laser chips 111*b* in the first row of laser chips 111 is greater than the quantity of the first-color laser chips 111*a*, that is, the quantity of the green laser chips is greater than the quantity of the blue laser chips. When the size of the laser array 110 is smaller, the quantity of the blue laser chips with higher luminous efficiency may be reduced, so that the quantity of the laser chips in the laser array 110 can be reduced on the premise of not affecting the luminous effect of the laser array 110.

Figure 5:
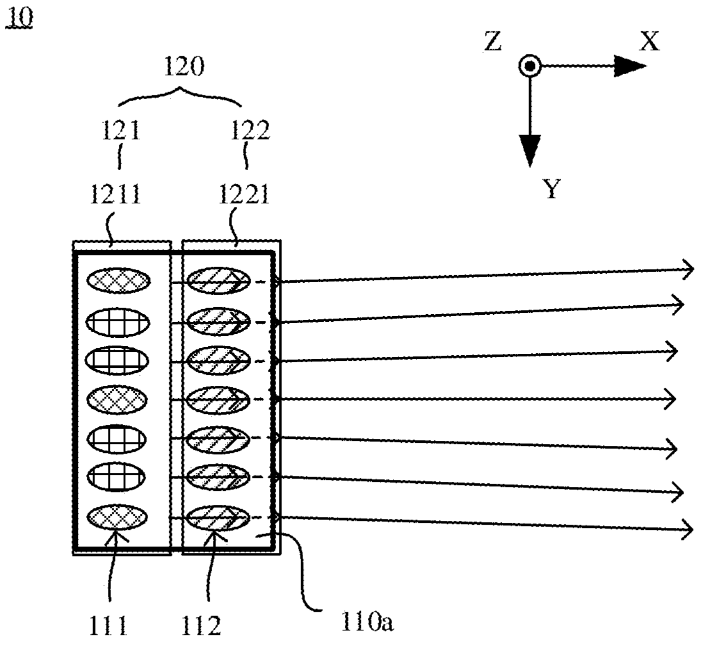
FIG. 5 is a top view of the light source shown in FIG. 3.

FIG. 5 is a top view of the light source shown in FIG. 3. Referring to FIG. 5, in some embodiments, the light combining mirror group 120 includes a first light combining unit 121 and a second light combining unit 122.

The first light combining unit 121 is configured to receive light beams emitted by the first row of laser chips 111. Exemplarily, on a light exit surface 110*a* of the laser array (e.g., parallel to an X-Y plane, and the X-Y plane is defined by the first direction X and the second direction Y), at least part of an orthographic projection of the first row of laser chips 111 is disposed within an orthographic projection of the first light combining unit 121. In this way, at least part of the laser beams emitted by the first row of laser chips 111 can irradiate the first light combining unit 121. It should be noted that in a light exit direction of the first row of laser chips 111, other elements (such as beam reducing lenses) may or may not be disposed between the first light combining unit 121 and the first row of laser chips 111, which is not limited by the present disclosure as long as the first light combining unit 121 can receive the laser beams emitted by the first row of laser chips 111.

The second light combining unit 122 is configured to receive the light beams emitted by the second row of laser chips 112. Exemplarily, on the light exit surface 110*a* of the laser array, at least part of an orthographic projection of the second row of laser chips 112 is disposed within an orthographic projection of the second light combining unit 122. In this way, at least part of the laser beams emitted by the second row of laser chips 112 can irradiate the second light combining unit 122. It should be noted that in a light exit direction of the second row of laser chips 112, other elements (such as beam reducing lenses) may or may not be disposed between the second light combining unit 122 and the second row of laser chips 112, which is not limited by the present disclosure as long as the second light combining unit 122 can receive the laser beams emitted by the second row of laser chips 112.

An arrangement direction of the first light combining unit 121 and the second light combining unit 122 is parallel to the arrangement direction of the first row of laser chips 111 and the second row of laser chips 112. Exemplarily, the arrangement direction of the first light combining unit 121 and the second light combining unit 122 is parallel to the first direction X.

Based on the above arrangement, the first light combining unit 121 may be configured to receive the laser beams emitted by respective first-color laser chips and respective second-color laser chips in the first row of laser chips 111, the second light combining unit 122 may be configured to receive the laser beams emitted by respective red laser chips in the second row of laser chips 112, and the first light combining unit 121 and the second light combining unit 122 may combine respectively received laser beams. For example, the first light combining unit 121 and the second light combining unit 122 may combine the first color laser beams emitted by respective first-color laser chips and the second color laser beams emitted by respective second-color laser chips in the first row of laser chips 111 and the red laser beams emitted by respective red laser chips in the second row of laser chips 112. Exemplarily, the light path of the laser beams emitted by the first row of laser chips 111 from the first light combining unit 121 approximately coincides with the light path of the laser beams emitted by the second row of laser chips 112 from the second light combining unit 122.

Compared with the related art in which the light combining mirror group includes three or more light combining units, the light path of the light combining mirror group in some embodiments of the present disclosure is relatively simple and the optical structure is relatively simple, so that the light path of the light source is relatively simple, and the size of the light source can be further reduced.

Referring to FIG. 3, in some embodiments, the first light combining unit 121 includes a first reflective mirror 1211, and the second light combining unit 122 includes a dichroic mirror 1221. The first reflective mirror 1211 is configured to receive the laser beams emitted by the first row of laser chips 111 and reflect the laser beams emitted by the first row of laser chips 111 towards the dichroic mirror 1221. The dichroic mirror 1221 is configured to receive and reflect the laser beams emitted by the second row of laser chips 112 and transmit the laser beams emitted by the first row of laser chips 111. In this way, the first light combining unit 121 and the second light combining unit 122 can combine the laser beams emitted by the first row of laser chips 111 and the second row of laser chips 112, and the second light combining unit 122 can emit the light beam along the arrangement direction (e.g., the first direction X) of the first light combining unit 121 and the second light combining unit 122.

Figure 6:
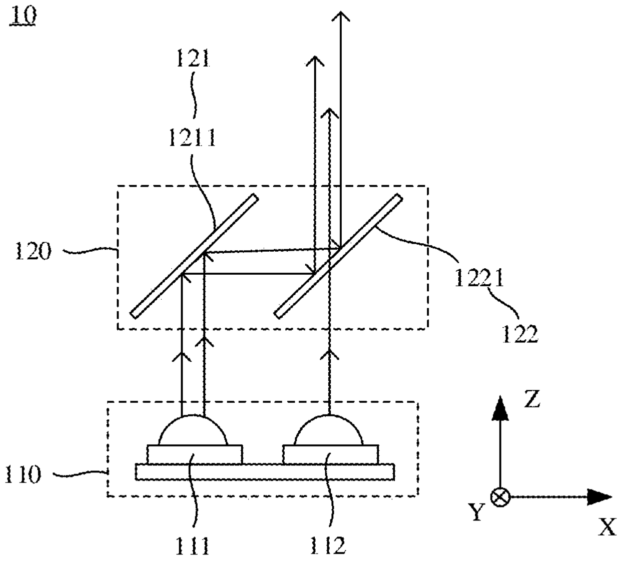
FIG. 6 is a structural diagram of another light source according to some embodiments.

FIG. 6 is a structural diagram of another light source according to some embodiments. Referring to FIG. 6, for the laser chips in some embodiments, the dichroic mirror 1221 is configured to receive and transmit the laser beams emitted by the second row of laser chips 112 and reflect the laser beams emitted by the first row of laser chips 111. In this way, the first light combining unit 121 and the second light combining unit 122 can combine the laser beams emitted by the first row of laser chips 111 and the second row of laser chips 112, and the light beam emitted by the second light combining unit 122 can have a propagation direction different from the arrangement direction (e.g., the first direction X) of the first light combining unit 121 and the second light combining unit 122, for example, the second light combining unit 122 can emit the light beam along a direction parallel to the third direction Z.

Referring to FIG. 3 and FIG. 6, since an area of the light beams emitted by the first row of laser chips 111 may be less than or equal to an overlapping area of the light beams emitted by the first row of laser chips 111 and the second row of laser chips 112, an area of the first reflective mirror 1211 may be less than or equal to that of the dichroic mirror 1221. In this way, the dichroic mirror 1221 can receive all the light beams emitted by the first row of laser chips 111 and the second row of laser chips 112.

Figures 7A, 7B:
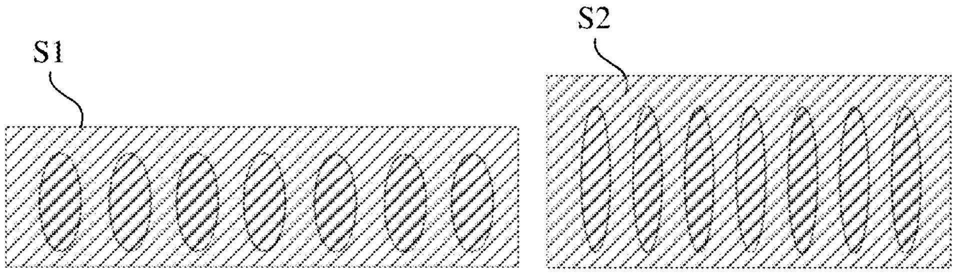
FIG. 7A is a structural diagram of a light spot of a light beam emitted by a light combining mirror group according to some embodiments.
FIG. 7B is a structural diagram of a light spot of a light beam emitted by a wedge-shaped light pipe or a shaping lens group according to some embodiments.

The light source 10 may emit the light spots of different colors in sequence when working. For example, at a moment, the light source 10 only emits the light spot of one color. FIG. 7A is a structural diagram of a light spot of a light beam emitted by a light combining mirror group according to some embodiments. Referring to FIG. 7A, the light beams emitted by the plurality of laser chips of the same color are combined to form a rectangular light spot S1. Since the laser chips of the same color in the laser array are disposed in the same row, and one light combining unit (such as the first light combining unit or the second light combining unit) in the light combining mirror group can receive the laser beams emitted by one row of laser chips, the size of the light spot S1 acquired after the laser beams emitted by one or more laser chips of the same color in the same row pass through the light combining mirror group is related to the position and arrangement of the one or more laser chips of the same color.

For example, since the length of one row of laser chips in the row direction is greater than that in the column direction (the column direction may be the arrangement direction of the first row of laser chips and the second row of laser chips, for example, perpendicular to the row direction), when one or more laser chips of the same color emit light, the length of the light spot S1 of the light beam coming from the light combining mirror group is larger in one direction and smaller in the other direction. For example, the ratio between a long side length and a short side length of the light spot S1 is approximately 3:1 (sometimes even 7:1). However, the aspect ratio of a projection screen for receiving the light beam emitted by the light source is about 16:9, which leads to the shape of the light spot formed by the light beam exiting the light combining mirror group not matching the shape of the projection screen.

In order to solve the above problem, the light source further includes a light spot shaping component. The light spot shaping component is configured to receive and adjust the light beam coming from the light combining mirror group, so that the difference between the length of the light spot of the light beam exiting the light spot shaping component in a long side direction and the length thereof in a short side direction is less than the difference of the length of the light spot of the light beam incident to the light spot shaping component in a long side direction and the length thereof in a short side direction. It should be noted that the dimensions of the light spots on the incident and exit surfaces of the optics may be very small, making it difficult to carry out measurements for the above-described differences on the incident or exit surfaces of the optics. Therefore, the method of measuring the two difference values herein may be, for example, to provide a beam receiver at a distance of 10 mm, 20 mm, 50 mm or more in the direction of propagation of the two beams, and to determine the result of the comparison of the above-described two difference values in the pattern of the light spots detected at the beam receiver.

Figure 8:
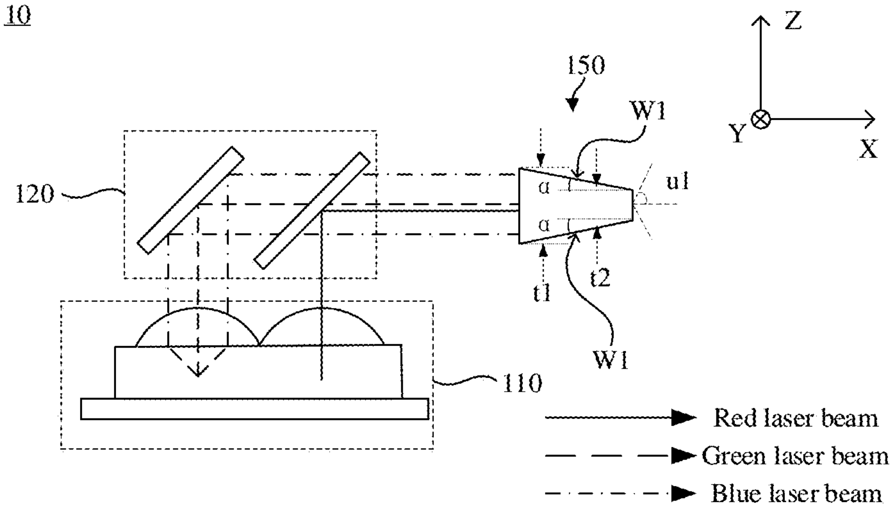
FIG. 8 is a structural diagram of yet another light source according to some embodiments.

FIG. 8 is a structural diagram of another light source according to some embodiments. Referring to FIG. 8, in some embodiments, the light spot shaping component in the light source 10 includes a light pipe (e.g., a wedge-shaped light pipe 150). The wedge-shaped light pipe 150 is configured to receive and adjust the light beam coming from the light combining mirror group 120. In order to achieve the purpose that the wedge-shaped light pipe 150 receives the light beam coming from the light combining mirror group 120, the wedge-shaped light pipe 150 is disposed on a light exit path of the light combining mirror group 120. It may also be said that the light combining mirror group 120 is disposed between the laser array 110 and the wedge-shaped light pipe 150 along the extending direction of a light path of the light emitted by the laser array in the light source 10.

It should be noted that there may or may not be other elements (such as beam reducing lenses) between the wedge-shaped light pipe 150 and the light combining mirror group 120, which is not limited by the present disclosure as long as the light from the light combining mirror group 120 can pass through the wedge-shaped light pipe 150.

The wedge-shaped light pipe 150 may adjust the light beam coming from the light combining mirror group 120, so that the absolute value of the difference between a first exit angle and a second exit angle of the light beam exiting the wedge-shaped light pipe 150 is less than the absolute value of the difference between a first exit angle and a second exit angle of the light beam incident to the wedge-shaped light pipe 150. It should be noted that, herein, the first exit angle of the light beam is an exit angle corresponding to a short side of the light spot of the light beam, and the second exit angle of the light beam is an exit angle corresponding to a long side of the light spot of the light beam.

In this way, the absolute value of the difference between the first exit angle and the second exit angle of the light beam adjusted by the wedge-shaped light pipe 150 is smaller, that is, the difference between the first exit angle and the second exit angle of the light beam adjusted by the wedge-shaped light pipe 150 is smaller. FIG. 7B is a structural diagram of the light spot of the light beam emitted by the wedge-shaped light pipe according to some embodiments. As can be seen from FIG. 7B, the difference between the length of the light spot S2 of the light beam adjusted by the wedge-shaped light pipe 150 in the long side direction and the length thereof in the short side direction is reduced.

In addition, considering the quantity of the laser chips of the same color in one row of laser chips and the divergence angles of the fast axis and the slow axis of each laser chip, the ratio between the long side length and the short side length of the light spot S1 is larger. Therefore, most of energy of the laser beam is concentrated in the long side direction of the light spot S1. Thus, the uniformity of the light beam exiting the light combining mirror group is poorer. Based on this, since the difference between the length of the light spot S2 of the light beam adjusted by the wedge-shaped light pipe 150 in the long side direction and the length thereof in the short side direction is reduced, the uniformity of energy distribution of the light beam coming from the light combining mirror group 120 after passing through the wedge-shaped light pipe 150 can be improved.

It should be noted that in some embodiments of the present disclosure, the light spot of the light beam coming from the light combining mirror group 120 refers to the light spot formed by the light beam on a plane perpendicular to the light exit direction of the light source 10. For example, the light exit direction of the light source 10 is parallel to the arrangement direction of the light combining mirror group 120 and the wedge-shaped light pipe 150, for example, parallel to the first direction X. Based on this, the following will take the case that the long side direction of the light spot of the light beam coming from the light combining mirror group 120 is parallel to the second direction Y, and the short side direction of the light spot is parallel to the third direction Z as an example for illustration. It is understandable that the long side and short side of the light spot from the light combining mirror group 120 may also extend in other directions, which is not limited by the present disclosure.

It should be noted that the wedge-shaped light pipe 150 is a tubular device formed by splicing four planar reflective sheets, that is, a hollow light pipe. The light may be reflected many times inside the wedge-shaped light pipe 150 to achieve the effect of light homogenization. The wedge-shaped light pipe 150 may also be a solid light pipe. In addition, the areas of a light incident surface and a light exit surface of the wedge-shaped light pipe 150 may be different. The light beam enters from the light incident surface of the wedge-shaped light pipe 150, and is then exit from the light exit surface of the wedge-shaped light pipe 150, and the light beam homogenization and light spot optimization are completed in the process of passing through the wedge-shaped light pipe 150. It should also be noted that when the light source 10 includes the wedge-shaped light pipe 150, the first light homogenizing component 210 in the light modulating component 20 may be omitted.

Referring to FIG. 8, in some embodiments, a length t1 of the light incident surface of the wedge-shaped light pipe 150 in the short side direction (e.g., the third direction Z) of the light spot of the light beam coming from the light combining mirror group 120 is greater than the length t2 of the light exit surface of the wedge-shaped light pipe 150 in the short side direction of the light spot. In this way, after the light beam coming from the light combining mirror group 120 passes through the wedge-shaped light pipe 150, the first exit angle of the light beam is increased, and it can be realized that the absolute value of the difference between the first exit angle and the second exit angle of the light beam exiting the wedge-shaped light pipe 150 is less than the absolute value of the difference between the first exit angle and the second exit angle of the light beam incident to the wedge-shaped light pipe 150.

Figure 9A:
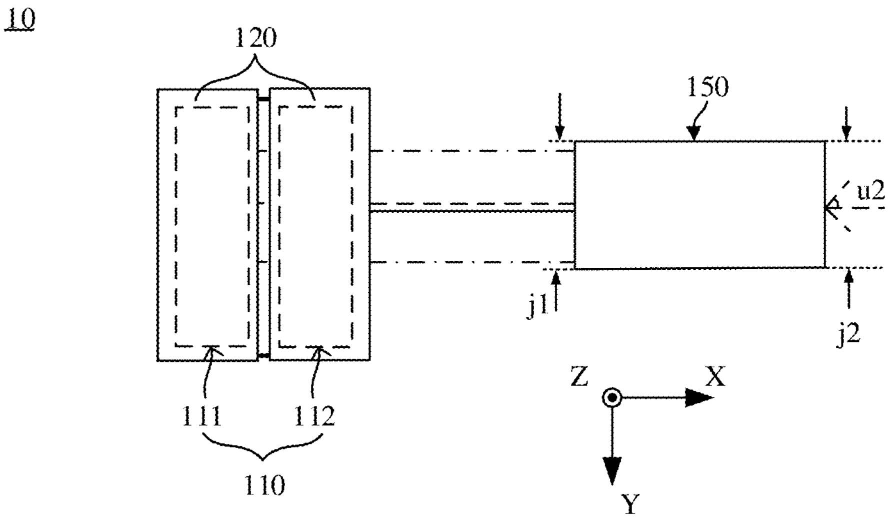
FIG. 9A is a top view of the light source shown in FIG. 8.

FIG. 9A is a top view of the light source shown in FIG. 8. Referring to FIG. 8 and FIG. 9A, in some embodiments, the length t1 of the light incident surface of the wedge-shaped light pipe 150 in the short side direction (e.g., the third direction Z) of the light spot of the light beam coming from the light combining mirror group 120 is greater than the length t2 of the light exit surface of the wedge-shaped light pipe 150 in the short side direction of the light spot. In addition, a length j1 of the light incident surface of the wedge-shaped light pipe 150 in the long side direction (e.g., the second direction Y) of the light spot is equal to a length j2 of the light exit surface of the wedge-shaped light pipe 150 in the long side direction of the light spot. In this case, after the light beam coming from the light combining mirror group 120 passes through the wedge-shaped light pipe 150, the first exit angle u1 of the light beam can be increased, while the second exit angle u2 of the light beam can be unchanged.

Figure 9B:
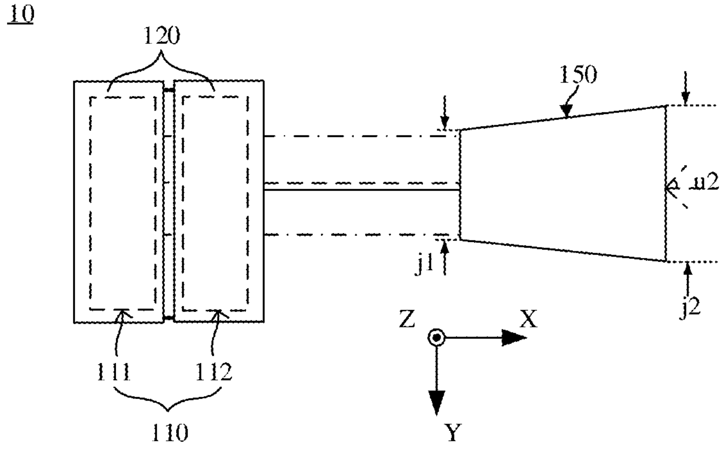
FIG. 9B is another top view of the light source shown in FIG. 8.

FIG. 9B is another top view of the light source shown in FIG. 8. In some embodiments, the length t1 of the light incident surface of the wedge-shaped light pipe 150 in the short side direction (e.g., the third direction Z) of the light spot of the light beam coming from the light combining mirror group 120 is greater than the length t2 of the light exit surface of the wedge-shaped light pipe 150 in the short side direction of the light spot. In addition, the length j1 of the light incident surface of the wedge-shaped light pipe 150 in the long side direction (e.g., the second direction Y) of the light spot is less than the length j2 of the light exit surface of the wedge-shaped light pipe 150 in the long side direction of the light spot. In this case, after the light beam coming from the light combining mirror group 120 passes through the wedge-shaped light pipe 150, the first exit angle u1 of the light beam can be increased, while the second exit angle u2 of the light beam can be decreased.

Figure 9C:
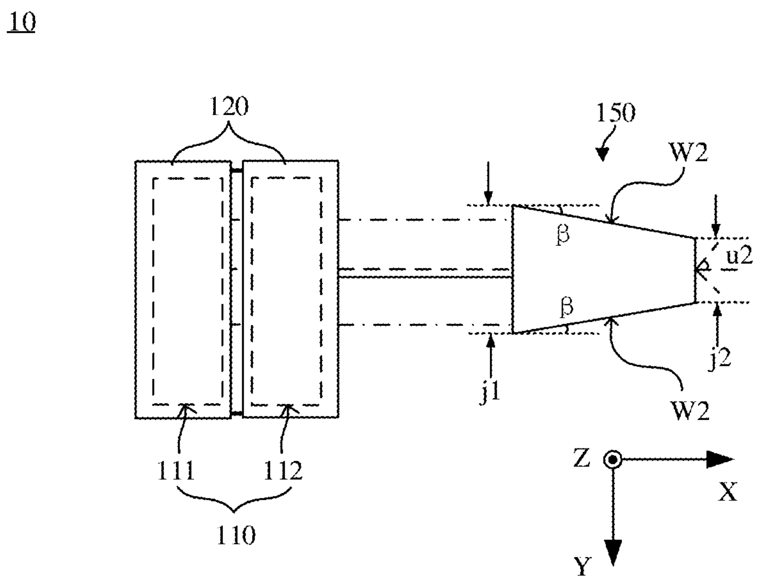
FIG. 9C is yet another top view of the light source shown in FIG. 8.

FIG. 9C is yet another top view of the light source shown in FIG. 8. In some embodiments, the length t1 of the light incident surface of the wedge-shaped light pipe 150 in the short side direction (e.g., the third direction Z) of the light spot of the light beam coming from the light combining mirror group 120 is greater than the length t2 of the light exit surface of the wedge-shaped light pipe 150 in the short side direction of the light spot. In addition, the length j1 of the light incident surface of the wedge-shaped light pipe 150 in the long side direction (e.g., the second direction Y) of the light spot is greater than the length j2 of the light exit surface of the wedge-shaped light pipe 150 in the long side direction of the light spot. Further, the wedge-shaped light pipe 150 has two oppositely disposed first side surfaces W1 disposed between the light incident surface and the light exit surface and two oppositely disposed second side surfaces W2. The two first side surfaces W1 are arranged along the short side direction of the light spot, and the two second side surfaces W2 are arranged along the long side direction of the light spot. An included angle α between one first side surface W1 (e.g., each first side surface W1) and the light exit direction (e.g., the first direction X) of the light source 10 is greater than an included angle β between one second side surface W2 (e.g., each second side surface W2) and the light exit direction of the light source 10.

In the case where the wedge-shaped light pipe 150 has the above arrangement, since the length t1 is greater than the length t2 and the length j1 is greater than the length j2, the first exit angle u1 of the light beam exiting the wedge-shaped light pipe 150 can be increased and the second exit angle u2 can also be increased. Since the included angle α is greater than the included angle β, the first exit angle u1 of the light beam can be increased to a greater extent than the second exit angle.

Figure 10A:
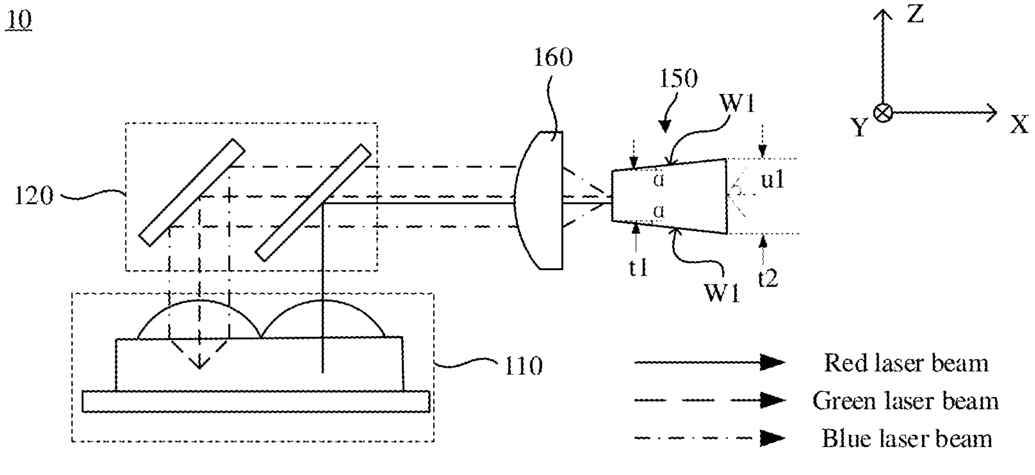
FIG. 10A is a structural diagram of still yet another light source according to some embodiments.
Figure 10B:
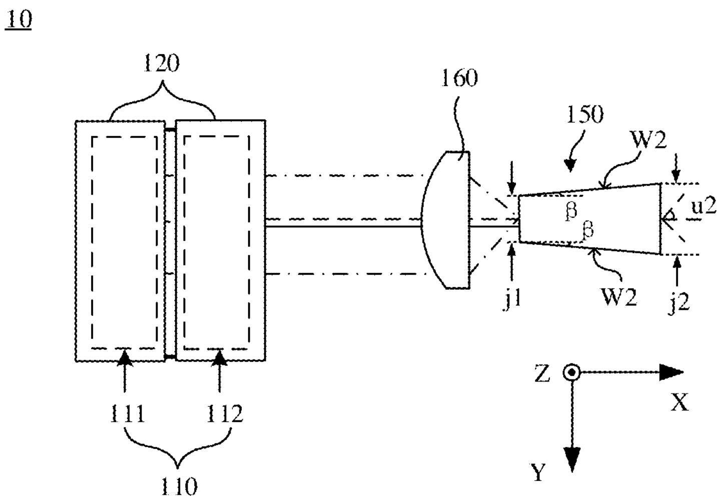
FIG. 10B is a top view of the light source shown in FIG. 10A.

FIG. 10A is a structural diagram of still yet another light source according to some embodiments, and FIG. 10B is a top view of the light source shown in FIG. 10A. Referring to FIG. 10A and FIG. 10B, in some embodiments, the length t1 of the light incident surface of the wedge-shaped light pipe 150 in the short side direction (e.g., the third direction Z) of the light spot from the light combining mirror group 120 is less than or equal to the length t2 of the light exit surface of the wedge-shaped light pipe 150 in the short side direction of the light spot. In addition, the length j1 of the light incident surface of the wedge-shaped light pipe 150 in the long side direction (e.g., the second direction Y) of the light spot is less than the length j2 of the light exit surface of the wedge-shaped light pipe 150 in the long side direction of the light spot. Further, the wedge-shaped light pipe 150 has two oppositely disposed first side surfaces W1 disposed between the light incident surface and the light exit surface and two oppositely disposed second side surfaces W2. The two first side surfaces W1 are arranged along the short side direction of the light spot, and the two second side surfaces W2 are arranged along the long side direction of the light spot. The included angle α between one first side surface W1 (e.g., each first side surface W1) and the light exit direction of the light source 10 is less than the included angle β between one second side surface W2 (e.g., each second side surface W2) and the light exit direction of the light source 10.

In the case where the wedge-shaped light pipe 150 has the above arrangement, since the length t1 is less than or equal to the length t2 and the length j1 is less than the length j2, the first exit angle u1 of the light beam exiting the wedge-shaped light pipe 150 can be unchanged or reduced, and the second exit angle u2 can be reduced. Moreover, since the included angle α is less than the included angle β, the first exit angle u1 of the light beam can be reduced to a lesser extent than the second exit angle u2 of the light beam. In this way, it can also be realized that the absolute value of the difference between the first exit angle u1 and the second exit angle u2 of the light beam exiting the wedge-shaped light pipe 150 is less than the absolute value of the difference between the first exit angle and the second exit angle of the light beam incident to the wedge-shaped light pipe 150.

Referring to FIG. 8, FIG. 9C, FIG. 10A and FIG. 10B, in some embodiments, in the wedge-shaped light pipe 150, the included angle α between each first side surface W1 and the light exit direction of the light source 10 is the same, and the included angle β between each second side surface W2 and the light exit direction of the light source 10 is also the same. In this way, the wedge-shaped light pipe 150 is axisymmetric with respect to an optical axis of the wedge-shaped light pipe 150, but not limited thereto. In some embodiments, the wedge-shaped light pipe 150 may also be non-axisymmetric with respect to the optical axis of the wedge-shaped light pipe 150. For example, the included angle between each first side surface W1 and the light exit direction of the light source 10 is different, or the included angle between each second side surface W2 and the light exit direction of the light source 10 is different.

Some embodiments of the present disclosure do not limit the arrangement directions of the laser array, the light combining mirror group and the wedge-shaped light pipe, as long as the laser beam emitted by the laser array can pass through the light combining mirror group and the wedge-shaped light pipe. In some embodiments, referring to FIGS. 8-10B, the arrangement direction (e.g., the third direction Z) of the laser array 110 and the light combining mirror group 120 is perpendicular to the arrangement direction (e.g., the first direction X) of the light combining mirror group 120 and the wedge-shaped light pipe 150. In some other embodiments, referring to FIG. 11, the arrangement direction of the laser array 110 and the light combining mirror group 120 may also be parallel to the arrangement direction of the light combining mirror group 120 and the wedge-shaped light pipe 150. Exemplarily, referring to the above description, the second light combining unit 122 in the light combining mirror group 120 may be a dichroic mirror, and may receive and transmit the laser beams emitted by the second row of laser chips 112 and reflect the laser beams emitted by the first row of laser chips 111. In this case, the second light combining unit 122 can emit the light beam in a direction parallel to the first direction X, and the arrangement direction of the laser array 110 and the light combining mirror group 120 and the arrangement direction of the light combining mirror group 120 and the wedge-shaped light pipe 150 may all be parallel to the first direction X.

Figure 11:
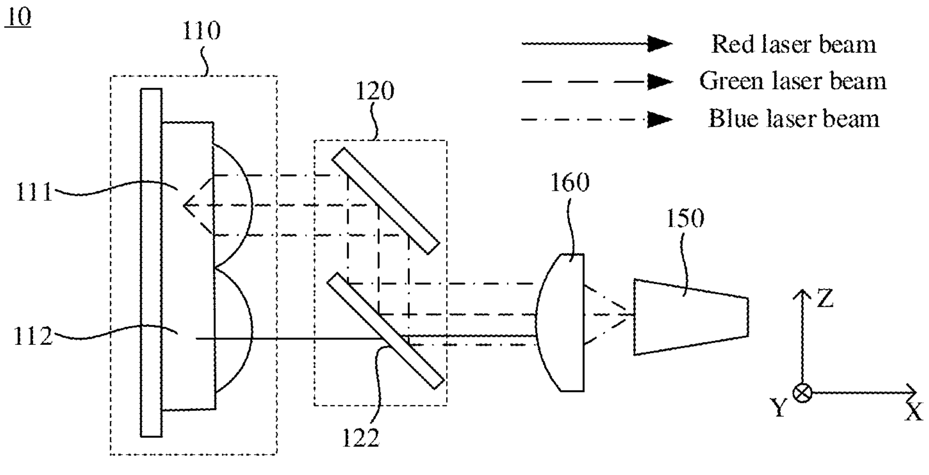
FIG. 11 is a structural diagram of still yet another light source according to some embodiments.

Referring to FIG. 10A, FIG. 10B and FIG. 11, in some embodiments, the light source 10 further includes a beam reducing lens 160. The beam reducing lens 160 is disposed between the light combining mirror group 120 and the wedge-shaped light pipe 150. Exemplarily, the laser beam emitted by the laser array 110 may pass through the light combining mirror group 120, the beam reducing lens 160 and the wedge-shaped light pipe 150 in sequence. The beam reducing lens 160 is configured to converge the light beam exiting the light combining mirror group 120 and guide the converged light beam to the wedge-shaped light pipe 150. In this way, the size of the light spot of the light beam received by the wedge-shaped light pipe 150 can be matched with the light incident surface of the wedge-shaped light pipe 150, and the loss of the light beam can be reduced.

Referring to FIGS. 8 to 9C, in some other embodiments, no lens assembly is disposed in the light source 10. In this case, as long as the minimum value of the length of the light incident surface of the wedge-shaped light pipe 150 in the short side direction (e.g., the third direction Z) of the light spot of the light beam coming from the light combining mirror group 120 is greater than or equal to the maximum value of the length of the light spot of the light beam coming from the light combining mirror group 120 in the short side direction, and the minimum value of the length of the light incident surface of the wedge-shaped light pipe 150 in the long side direction (e.g., the second direction Y) of the light spot of the light beam coming from the light combining mirror group 120 is greater than or equal to the maximum value of the length of the light spot of the light beam coming from the light combining mirror group 120 in the long side direction.

Figure 12:
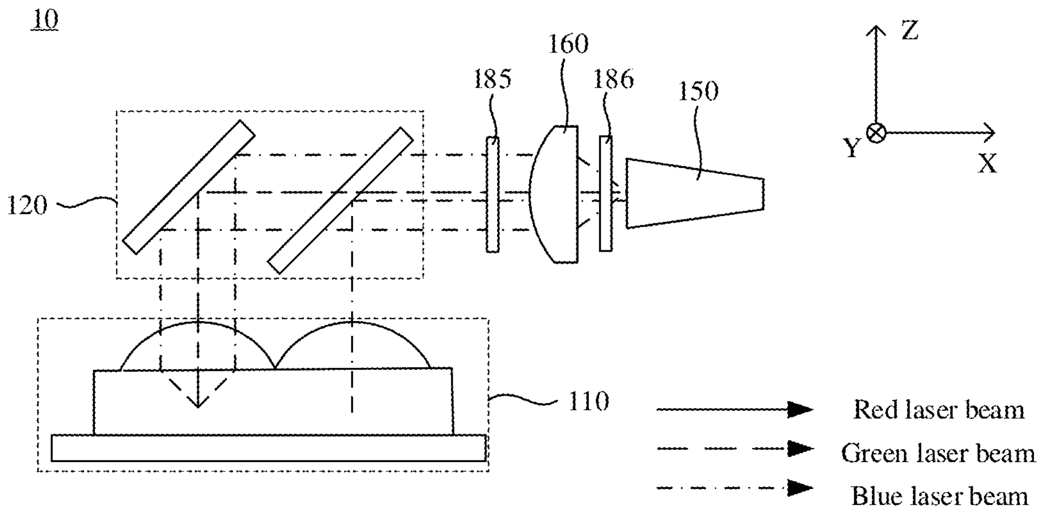
FIG. 12 is a structural diagram of still yet another light source according to some embodiments.

FIG. 12 is a structural diagram of still yet another light source according to some embodiments. Referring to FIG. 12, in some embodiments, the light source 10 further includes a diffusion sheet 185. The diffusion sheet 185 is disposed between the light combining mirror group 120 and the beam reducing lens 160 along the extending direction of a light path of the light beam coming from the light combining mirror group 120, that is, the light from the light combining mirror group 120 may be incident to the beam reducing lens 160 through the diffusion sheet 185. The diffusion sheet 185 may be configured to homogenize the laser beam incident thereto, and the uniformity of the light beam can be improved.

With continued reference to FIG. 12, in some embodiments, the light source 10 further includes a diffusion wheel 186. The diffusion wheel 186 is disposed between the beam reducing lens 160 and the wedge-shaped light pipe 150 along the extending direction of a light path of a light beam emitted by the beam reducing lens 160. The diffusion wheel 186 may be a rotating diffusion sheet, and may diffuse a converging light beam, increase a divergence angle of the light beam and increase a random phase to improve the uniformity of the light beam. In some embodiments, the light source 10 includes both the diffusion sheet 185 and the diffusion wheel 186. In this case, the laser beam may pass through the stationary diffusion sheet 186 and then the moving diffusion sheet (i.e., diffusion wheel 186). In this way, on the basis that the stationary diffusion sheet 185 homogenizes the light beam, the diffusion wheel 186 can homogenize the light beam again, which can enhance a homogenization effect of the laser beam and reduce an energy ratio of the light beam near an optical axis of the laser beam, thereby reducing a coherence of the laser beam and improving a speckle phenomenon of the projection picture.

Figure 13A:
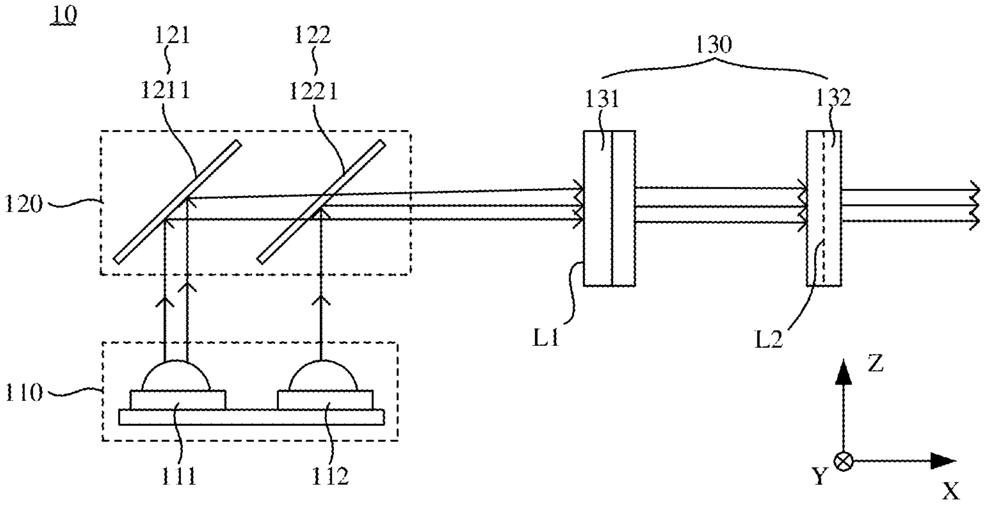
FIG. 13A is a structural diagram of still yet another light source according to some embodiments.
Figure 13B:
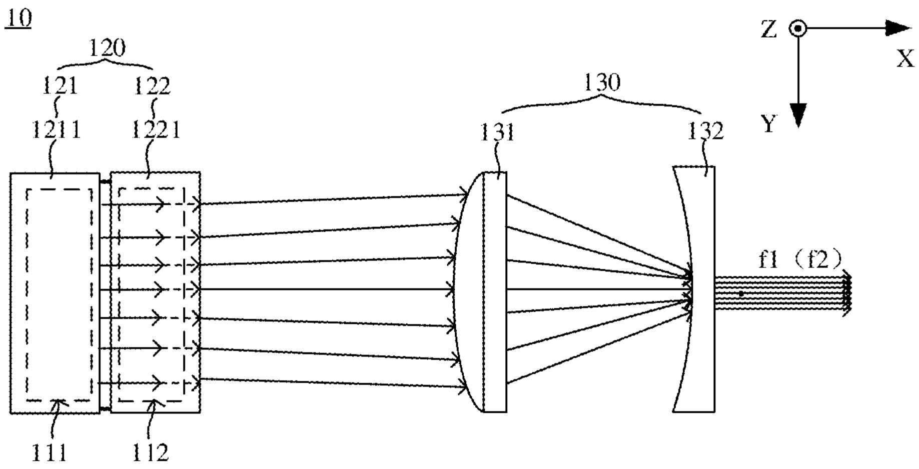
FIG. 13B is a top view of the light source shown in FIG. 13A.

FIG. 13A is a structural diagram of still yet another light source according to some embodiments. FIG. 13B is a top view of the light source shown in FIG. 13A. It should be noted that specific structures of the first row of laser chips and the second row of laser chips are omitted in FIG. 13B.

Referring to FIG. 13A and FIG. 13B, in some embodiments, the light spot shaping component in the light source 10 includes a shaping lens group 130 (a lens group consisting of lenses for beam shaping). The shaping lens group 130 includes a first cylindrical lens 131 and a second cylindrical lens 132. The first cylindrical lens 131 is configured to receive the light beam coming from the light combining mirror group 120 and guide the light beam to the second cylindrical lens 132. That is, the laser beams emitted by the first row of laser chips 111 and the second row of laser chips 112 may pass through the first cylindrical lens 131 and the second cylindrical lens 132 in sequence after passing through the light combining mirror group 120.

It should be noted that other elements (e.g., the beam reducing lens 160) may or may not be disposed between the first cylindrical lens 131 and the light combining mirror group 120, which is not limited by the present disclosure as long as the light beam coming from the light combining mirror group 120 can transmit through the first cylindrical lens 131 and the second cylindrical lens 132.

It should also be noted that the light source 10 in some embodiments includes not only the shaping lens group 130, but also the wedge-shaped light pipe 150. At this point, the shaping lens group 130 is disposed between the light combining mirror group 120 and the wedge-shaped light pipe 150 or the wedge-shaped light pipe 150 is disposed between the light combining mirror group 120 and the shaping lens group 130.

Figure 14:
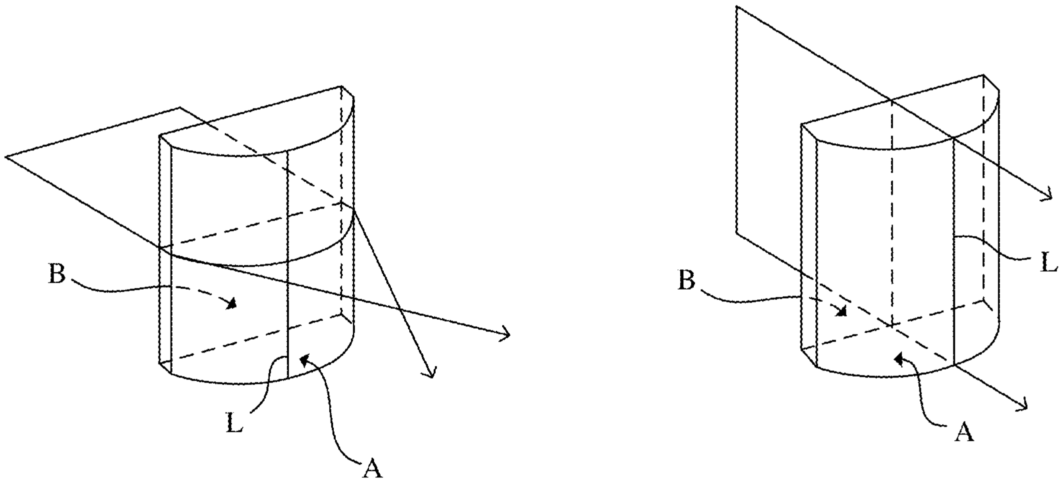
FIG. 14 is a schematic diagram of a light beam passing through a cylindrical lens.

FIG. 14 is a schematic diagram of a light beam passing through a cylindrical lens. It should be noted that the cylindrical lens in FIG. 14 is a plano-convex cylindrical lens. It is understandable that when the cylindrical lens is a plano-concave cylindrical lens, it also has different modulation effects on the light in different directions, and the relevant explanation may refer to the following. The main difference between the plano-concave cylindrical lens and the plano-convex cylindrical lens is that the plano-convex cylindrical lens can converge the light beam, while the plano-concave cylindrical lens can diffuse the light beam.

Referring to FIG. 14, the cylindrical lens (e.g., the first cylindrical lens or second cylindrical lens) has a cylindrical surface A and a flat surface B. The cylindrical lens has a curvature in the direction perpendicular to a generatrix L of the cylindrical surface and may change vergence of the light beam, but has no curvature in the direction parallel to the generatrix L of the cylindrical surface and does not change the vergence of the light beam. In this way, the cylindrical lens can be configured to change the size of the light beam passing through the cylindrical lens in one direction.

Referring to FIG. 13A and FIG. 13B, and referring to the above description, after the light beam coming from the light combining mirror group 120 passes through the first cylindrical lens 131 and the second cylindrical lens 132 of the shaping lens group 130, the length of the light spot of the light beam (e.g., the light spot formed on the plane perpendicular to the light exit direction of the second cylindrical lens) may be increased or decreased in the direction perpendicular to a generatrix L1 of the cylindrical surface of the first cylindrical lens 131, while the length in the direction parallel to the generatrix L1 of the cylindrical surface of the first cylindrical lens 131 may be unchanged. Moreover, the length of the light spot in the direction perpendicular to a generatrix L2 of the cylindrical surface of the second cylindrical lens 132 may also be increased or decreased, while the length in the direction parallel to the generatrix L2 of the cylindrical surface of the second cylindrical lens 132 may be unchanged. Based on this, through the first cylindrical lens 131 and the second cylindrical lens 132 in the shaping lens group 130, the length of the light spot of the light beam coming from the light combining mirror group 120 in the other direction can be adjusted on the premise of keeping the length of the light spot in one direction unchanged.

Referring to FIG. 13A and FIG. 13B, in some embodiments, the first cylindrical lens 131 is a plano-convex cylindrical lens and the second cylindrical lens 132 is a plano-concave cylindrical lens. The generatrix L1 of the cylindrical surface of the first cylindrical lens 131 is parallel to the generatrix L2 of the cylindrical surface of the second cylindrical lens 132, and a focal point f2 of the second cylindrical lens 132 coincides with a focal point f1 of the first cylindrical lens 131. In this case, the position where the focal point f2 of the second cylindrical lens 132 coincides with the focal point f1 of the first cylindrical lens 131 is disposed on one side of the second cylindrical lens 132 away from the first cylindrical lens 131. When the first cylindrical lens 131 and the second cylindrical lens 132 are disposed in the above manner, the approximately parallel light beam coming from the light combining mirror group 120 may be received by the first cylindrical lens 131, and the first cylindrical lens 131 converges the light beam in the direction (e.g., the direction parallel to the X-Y plane) perpendicular to the generatrix L1 of the first cylindrical lens 131 and then transmits to the second cylindrical lens 132. The second cylindrical lens 132 receives the light beam, and the second cylindrical lens 132 may diverge the light beam in the direction (e.g., the direction parallel to the X-Y plane) perpendicular to the generatrix L2 of the second cylindrical lens 132, so that the light beam transmitted through the second cylindrical lens 132 can be emitted approximately in parallel. In this way, the first cylindrical lens 131 and the second cylindrical lens 132 can reduce the length of the light spot of the light beam in the direction (e.g., the direction parallel to the X-Y plane) perpendicular to the generatrix L1 of the cylindrical surface of the first cylindrical lens 131 without changing the shape of the light spot of the light beam in this direction. In addition, since the position where the focal point f2 of the second cylindrical lens 132 coincides with the focal point f1 of the first cylindrical lens 131 is disposed on one side of the second cylindrical lens 132 away from the first cylindrical lens 131, the distance between the first cylindrical lens 131 and the second cylindrical lens 132 is shorter, and the overall volume of the light source 10 can be smaller.

Figure 15A:
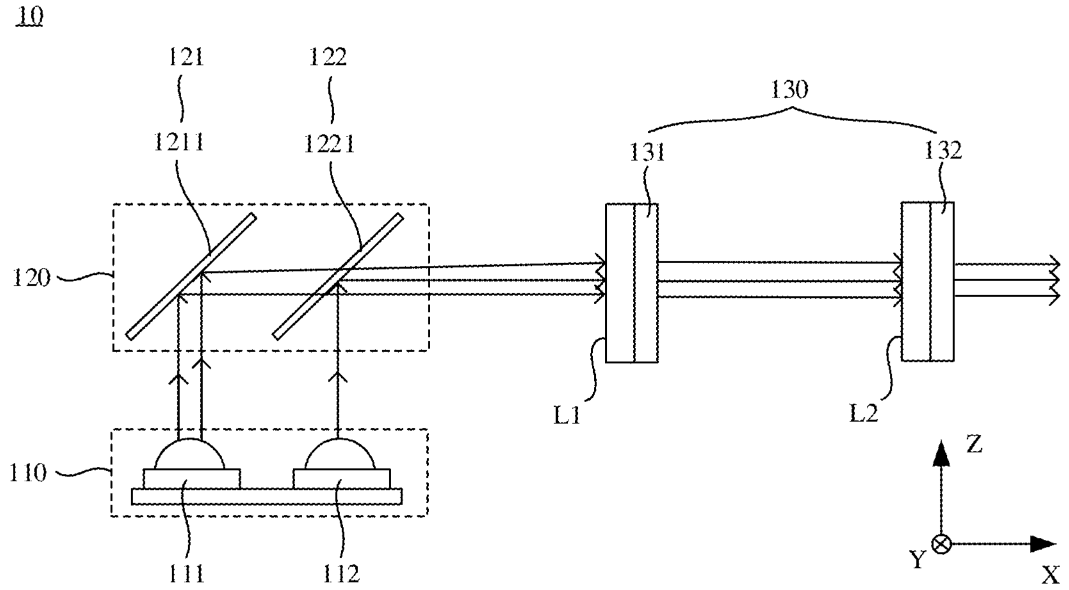
FIG. 15A is a structural diagram of still yet another light source according to some embodiments.
Figure 15B:
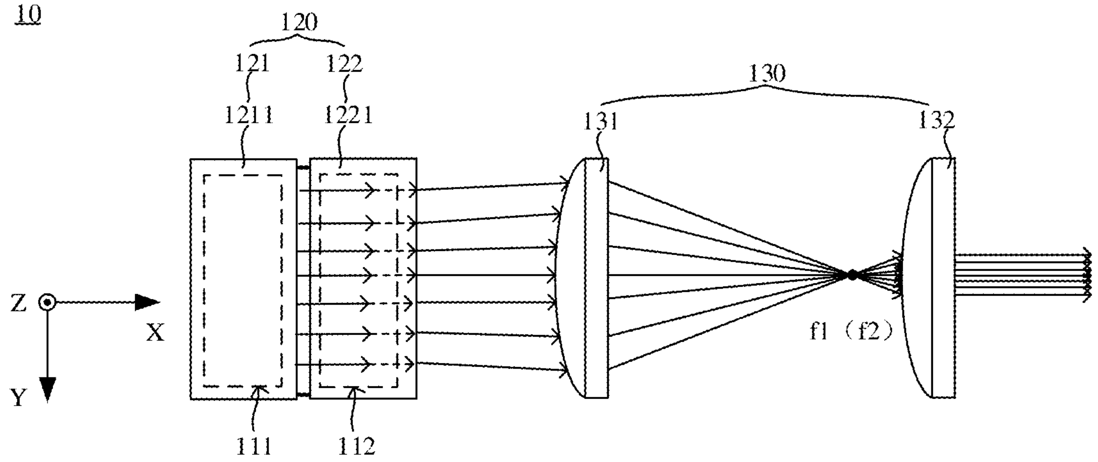
FIG. 15B is a top view of the light source shown in FIG. 15A.

FIG. 15A is a structural diagram of a light source according to some embodiments. FIG. 15B is a top view of the light source shown in FIG. 15A. It should be noted that specific structures of the first row of laser chips and the second row of laser chips are omitted in FIG. 15B.

Referring to FIG. 15A and FIG. 15B, in some other possible implementations, the first cylindrical lens 131 is a plano-convex cylindrical lens, and the second cylindrical lens 132 is also a plano-convex cylindrical lens. The generatrix L1 of the cylindrical surface of the first cylindrical lens 131 is parallel to the generatrix L2 of the cylindrical surface of the second cylindrical lens 132, and the focal point f2 of the second cylindrical lens 132 coincides with the focal point f1 of the first cylindrical lens 131. In this case, the position where the focal point f2 of the second cylindrical lens 132 coincides with the focal point f1 of the first cylindrical lens 131 is disposed between the second cylindrical lens 132 and the first cylindrical lens 131. When the first cylindrical lens 131 and the second cylindrical lens 132 are disposed in the above manner, the approximately parallel light beam coming from the light combining mirror group 120 may be received by the first cylindrical lens 131, and the first cylindrical lens 131 may converge the light beam in the direction (e.g., the direction parallel to the X-Y plane) perpendicular to the generatrix L1 of the first cylindrical lens 131 and then transmit to the second cylindrical lens 132. The second cylindrical lens 132 receives the light beam, and may enable the light beam transmitted through the second cylindrical lens 132 to be emitted approximately in parallel. In this way, the first cylindrical lens 131 and the second cylindrical lens 132 can reduce the length of the light beam in the direction (e.g., the direction parallel to the X-Y plane) perpendicular to the generatrix L1 of the cylindrical surface of the first cylindrical lens 131 without changing the shape of the light beam in this direction.

Figure 16:
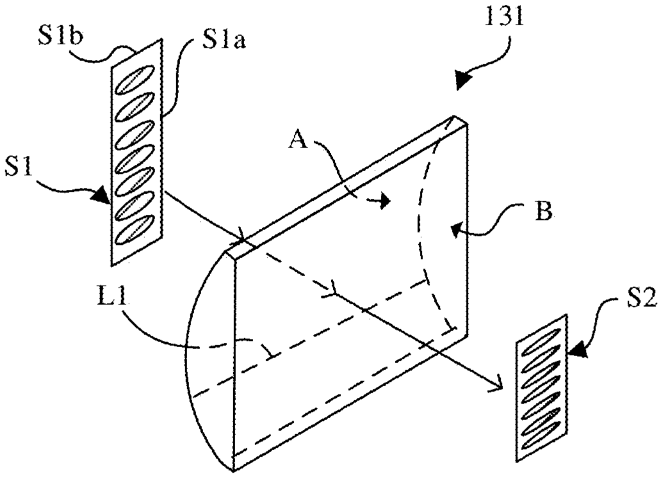
FIG. 16 is a schematic diagram that a light beam emitted by a light combining mirror group is transmitted through a first cylindrical lens according to some embodiments.

FIG. 16 is a schematic diagram that the light beam coming from the light combining mirror group is transmitted through the first cylindrical lens. Referring to FIG. 16, in some embodiments, referring to the above description, the light spot S1 of the light beam coming from the light combining mirror group is a rectangular light spot, and a long side Sla of the rectangular light spot is perpendicular to the generatrix L1 of the cylindrical surface of the first cylindrical lens 131. With reference to the above description, the first cylindrical lens 131 may be a plano-convex cylindrical lens, and the length of the light spot of the light beam coming from the light combining mirror group in the direction perpendicular to the generatrix L1 of the cylindrical surface of the plano-convex cylindrical lens may be reduced. Also, since the long side Sla of the rectangular light spot of the light beam coming from the light combining mirror group is perpendicular to the generatrix L1 of the cylindrical surface of the first cylindrical lens 131, the first cylindrical lens 131 can reduce the length of the light spot S1 in the long side direction thereof. In addition, a short side S1*b* of the rectangular light spot of the light beam coming from the light combining mirror group is parallel to the generatrix L1 of the cylindrical surface of the first cylindrical lens 131. Therefore, the first cylindrical lens 131 may not change the length of the light spot S1 in the short side direction thereof. Exemplarily, referring to FIG. 7A and FIG. 7B, FIG. 7B is a structural diagram of a light spot formed by the light beam transmitted through the shaping lens group. The first cylindrical lens may reduce the length of the light spot S1 in the long side direction thereof to one-third or one-half of the original length, and may form the light spot S2 shown in FIG. 7B. Compared with the light spot S1, the shape of the light spot S2 can be better matched with the shape of the projection screen, thus further improving use experience of a user.

In addition, since the long side of the rectangular light spot is perpendicular to the generatrix of the cylindrical surface of the first cylindrical lens, the first cylindrical lens has higher convergence efficiency for the light beam coming from the light combining mirror group, which can improve transmission efficiency of the light beam in the light source and reduce the brightness loss caused by larger divergence of the light beam coming from the light combining mirror group in a transmission process.

Figure 17:
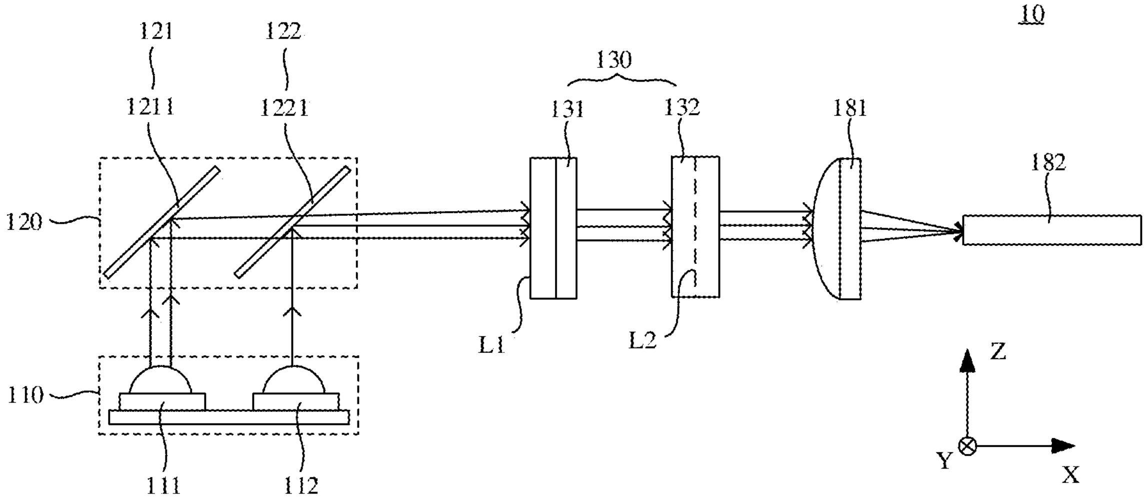
FIG. 17 is a structural diagram of still yet another light source according to some embodiments.

FIG. 17 is a structural diagram of still yet another light source according to some embodiments. Referring to FIG. 17, in some embodiments, the light source 10 further includes a beam reducing lens 181 and a second light homogenizing component 182. Exemplarily, the beam reducing lens 181 and the second light homogenizing component 182 may be sequentially disposed along an extending direction of a light path. The beam reducing lens 181 and the second light homogenizing component 182 may be configured to receive the light beam coming from the light combining mirror group 120 and adjust the light beam accordingly.

The beam reducing lens 181 may be a spherical lens or an aspheric lens. Exemplarily, the light source 10 includes two convex lenses (i.e., two beam reducing lenses 181), which may be both spherical lenses. Compared with the aspheric lens, the spherical lens is easier in shaping and precision control. Therefore, the manufacturing difficulty and cost of the light source can be less. Of course, the above two convex lenses may also be both aspheric lenses, which is not limited by the present disclosure.

The second light homogenizing component 182 is configured to shape and homogenize the received light beam. It should be noted that light beam homogenization may refer to the shaping of a light beam with uneven intensity distribution into a light beam with uniform intensity distribution.

The second light homogenizing component 182 may be a light pipe or a fly-eye lens. The light pipe may be a hollow light pipe, that is, a tubular device formed by splicing four planar reflective sheets. The light pipe may also be a solid light pipe. The light may be reflected many times in the light pipe, and the light homogenizing effect can be achieved. Exemplarily, a light inlet and a light outlet of the light pipe are rectangles with the same shape and area. When the light spot of the light beam received by the light pipe is rectangular, a long side of the rectangular light spot may be parallel to a long side of the rectangular light inlet of the second light homogenizing component 182. In this way, more light beams can be incident to the second light homogenizing component 182, and the loss of the light beams can be reduced.

The beam reducing lens 181 is configured to converge the light beam emitted by the second cylindrical lens 132 and guide the converged light beam to the second light homogenizing component 182. Exemplarily, a focal point of the beam reducing lens 181 may be set at a light incident surface of the second light homogenizing component 182. In this way, the light receiving efficiency of the second light homogenizing component 182 can be improved.

It should be noted that the beam reducing lens 181 and the beam reducing lens 160 may have the same structure and function, and the two are interchangeable. In addition, when the light source 10 includes the second light homogenizing component 182, the second light homogenizing component 182 may be the wedge-shaped light pipe 150 described above; and in this case, the first light homogenizing component 210 in the light modulating component 20 may be omitted.

Figure 18:
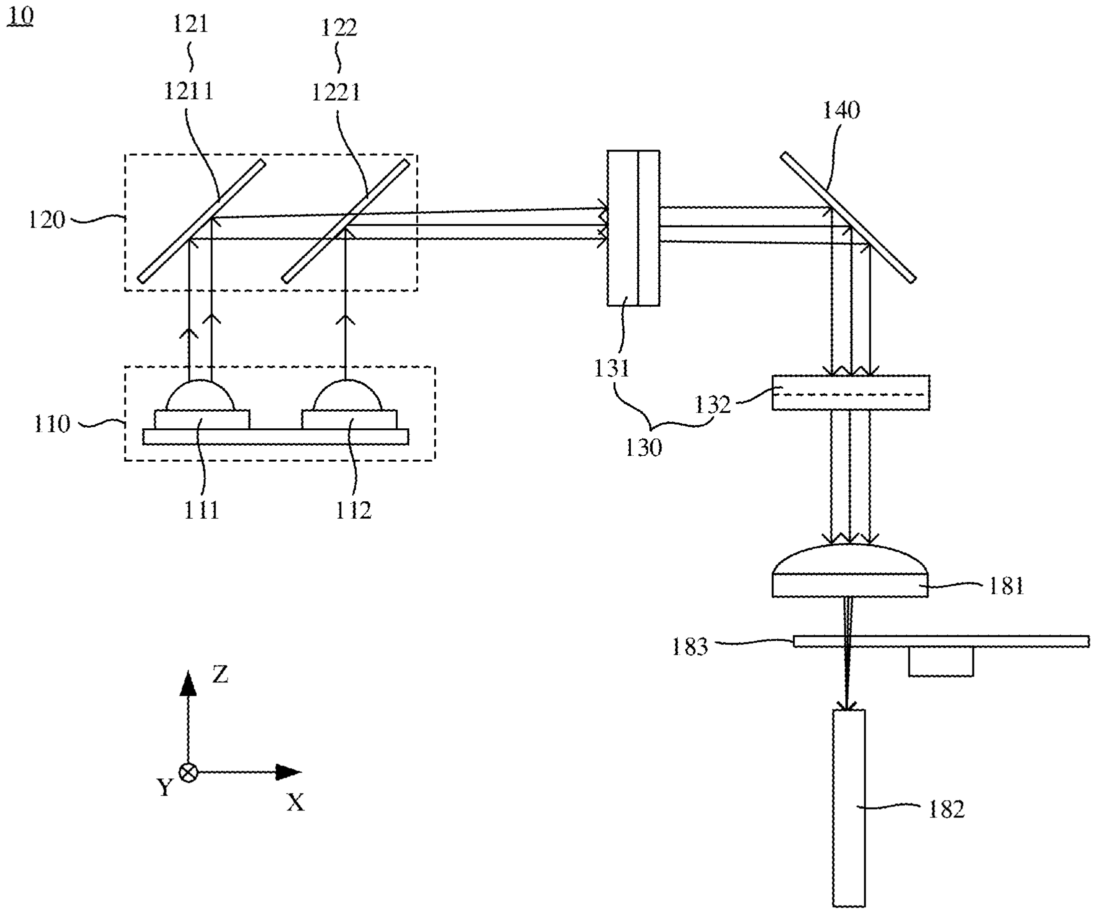
FIG. 18 is a structural diagram of still yet another light source according to some embodiments.

FIG. 18 is a structural diagram of still yet another light source according to some embodiments. Referring to FIG. 18, in some embodiments, the light source 10 further includes a second reflective mirror 140. The first cylindrical lens 131, the second reflective mirror 140 and the second cylindrical lens 132 are sequentially disposed along the extending direction of a light path.

The second reflective mirror 140 may bend the propagation path of the light beam in the light source 10, thereby reducing the length of the light source 10 in one direction. For example, the length of the light source 10 may be smaller in the exit direction (e.g., the first direction X) parallel to the light transmitted by the light combining mirror group 120. In some embodiments, the arrangement direction of the first cylindrical lens 131 and the second reflective mirror 140 is perpendicular to the arrangement direction of the second reflective mirror 140 and the second cylindrical lens 132. In this way, the second reflective mirror 140 can bend the propagation path of the light beam by 90 degrees, and the length of the light source 10 in one direction (e.g., the first direction X) can be further reduced.

As shown in FIG. 18, the light source 10 further includes a speckle dissipating component 183. The speckle dissipating component 183 may be a diffusion wheel or a vibration diffusion sheet. The speckle dissipating component 183 may play a speckle dissipating effect to further improve the uniformity of the light spot of the laser beam. Exemplarily, along the extending direction of a light path, the light speckle dissipating component 183 is disposed between the beam reducing lens 181 and the second light homogenizing component 182. When the speckle dissipating component 183 is a diffusion wheel, it may have the same structure and function as the diffusion wheel 186, and the two are interchangeable.

In the laser array, luminescent mechanisms of luminescent materials in the laser chips of different colors are different. Exemplarily, the blue laser chip and the green laser chip use gallium arsenide luminescent materials to generate the blue laser beam and the green laser beam, while the red laser chip uses a gallium nitride luminescent material to generate the red laser beam. Due to different luminescent mechanisms of the luminescent materials in the laser chips of different colors, the oscillation direction of a resonator of the red laser chip is different from the oscillation directions of resonators of the blue laser chip and the green laser chip in a luminescent process, so that a polarization direction of the red laser beam is different from a polarization direction of the blue laser beam and different from a polarization direction the green laser beam. Exemplarily, the red laser beam may be P polarized light, and the blue laser beam and the green laser beam may be S polarized light. The polarization direction of the P polarized light is perpendicular to the polarization direction of the S polarized light.

In the application of the laser projection device, the laser projection device may be equipped with an ultra-short focal projection screen with higher gain and contrast, such as a Fresnel optical screen, so as to better restore the projection picture with high brightness and high contrast. Since the Fresnel optical screen shows obvious differences in transmittance and reflectivity of the light beams of different polarization directions, when the polarization direction of the red laser beam is different from the polarization direction of the blue laser beam, and is also different from the polarization direction of the green laser beam, luminous fluxes of the light of different colors reflected by the screen into human eyes may be unbalanced, which will lead to the problem of color cast in local regions on the projection picture, and then lead to the phenomenon of uneven chromaticity such as "color blocks" in the projection picture.

Figure 19A:
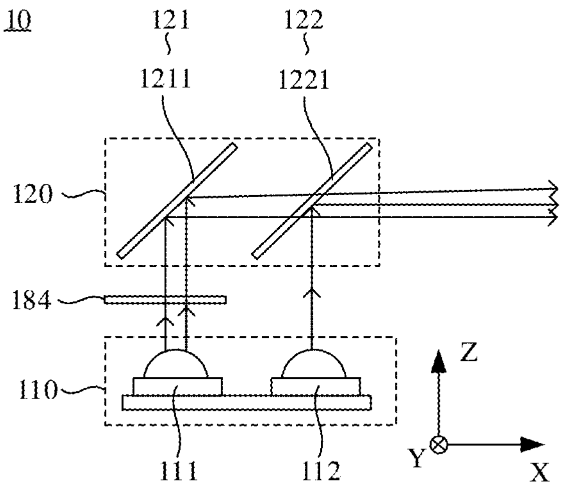
FIG. 19A is a structural diagram of still yet another light source according to some embodiments.
Figure 19B:
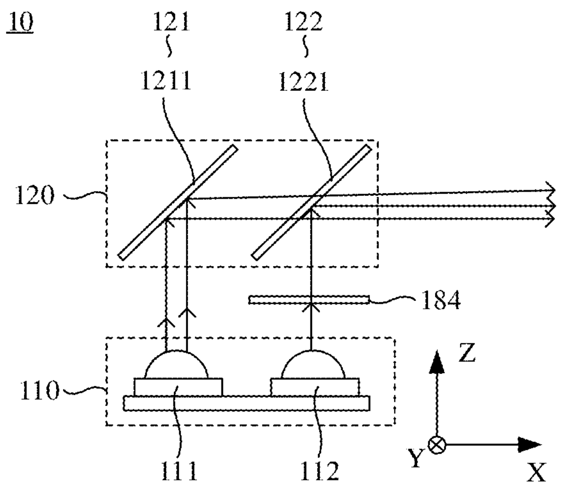
FIG. 19B is a structural diagram of still yet another light source according to some embodiments.

FIG. 19A is a structural diagram of still yet another light source according to some embodiments. FIG. 19B is a structural diagram of still yet another light source according to some embodiments. Referring to FIG. 19A and FIG. 19B, in order to solve the above problems, in some embodiments, the light source 10 further includes a half-wave plate 184. The half-wave plate 184 may be configured to change the polarization direction of the received light beam.

Referring to FIG. 19A, in some embodiments, the half-wave plate 184 is disposed between the light exit surface of the first row of laser chips 111 and the first light combining unit 121. The half-wave plate 184 may be disposed according to a wavelength between the first color laser beam (e.g., the blue laser beam) and the second color laser beam (e.g., the green laser beam). In this way, the polarization direction of the first color laser beams and the polarization direction of the second color laser beams emitted by the first row of laser chips 111 can be changed by 90 degrees after passing through the half-wave plate 184. For example, the blue laser beams and the green laser beams emitted by the first row of laser chips 111 pass through the half-wave plate 184 and then become the P polarized light. In this way, the polarization directions of the red laser beams, the first color laser beams and the second color laser beams emitted by the light source 10 are consistent, which can solve the problem of uneven chromaticity such as "color speckles" or "color blocks" on the projection picture.

Referring to FIG. 19B, in some other possible implementations, the half-wave plate 184 is disposed between the light exit surface of the second row of laser chips 112 and the second light combining unit 122. The half-wave plate 184 may be disposed according to a wavelength of the red laser beam. In this way, the polarization direction of the red laser beams emitted by the second row of laser chips 112 can be changed by 90 degrees after passing through the half-wave plate 184. For example, the red laser beams emitted by the second row of laser chips 112 pass through the half-wave plate 184 and then become the S polarized light. In this way, the polarization directions of the red laser beams, the first color laser beams and the second color laser beams emitted by the light source 10 are consistent, which can solve the problem of uneven chromaticity such as "color speckles" or "color blocks" on the projection picture.

In addition, in the case that the light beam coming from the light combining mirror group 120 has the consistent polarization direction, the light beam may have the same optical transmittance or reflectivity when passing through the same optical components (e.g., the shaping lens group 130, the second reflective mirror 140, the wedge-shaped light pipe 150, the beam reducing lenses 160 and 181, etc.). Therefore, the uniformity of the light beam can be improved, which is favorable to improve a projection display effect. However, the light emitted by such a light source has stronger coherence, which leads to a serious speckle effect in the projection picture of the laser projection device and a poorer display effect of the projection picture.

The speckle effect refers to that when two laser beams emitted by a coherent light source irradiate an optically rough surface (i.e., a surface with an average fluctuation greater than a wavelength order, such as a projection surface), the two laser beams interfere in space since a large quantity of irregularly distributed undulating structures on the optically rough surface scatter the two laser beams, resulting in a random spatial light intensity distribution of a formed reflected light field, and finally granular alternating light and dark speckles appear on the optically rough surface. These speckles may be called laser speckles. The speckle effect makes the display effect of the projected image poorer, and these alternating light and dark light speckles are in a flashing state to human eyes, which makes a viewer feel dizzy for a long time, resulting in poorer viewing experience.

Figure 20:
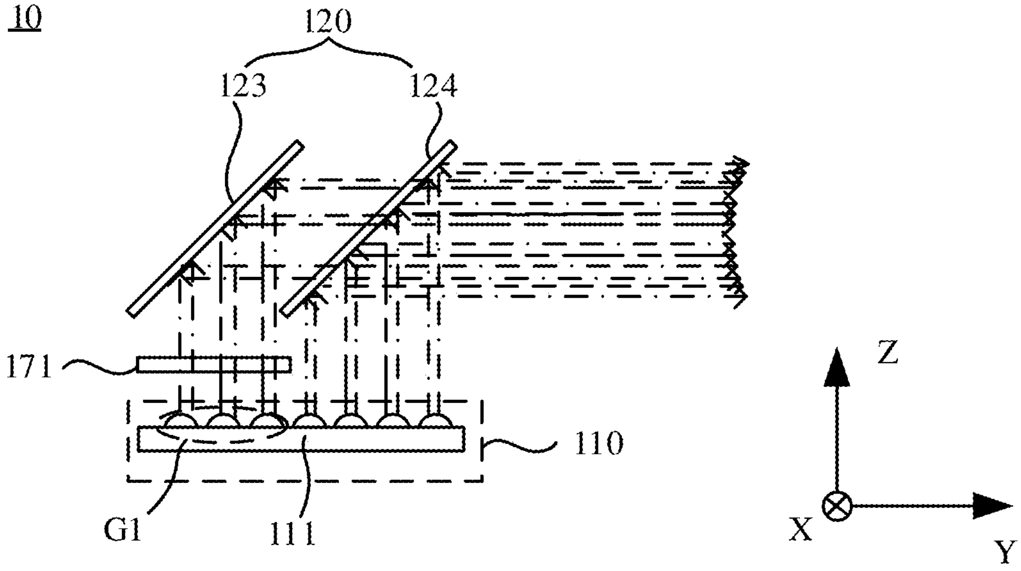
FIG. 20 is a structural diagram of still yet another light source according to some embodiments.
Figure 21:
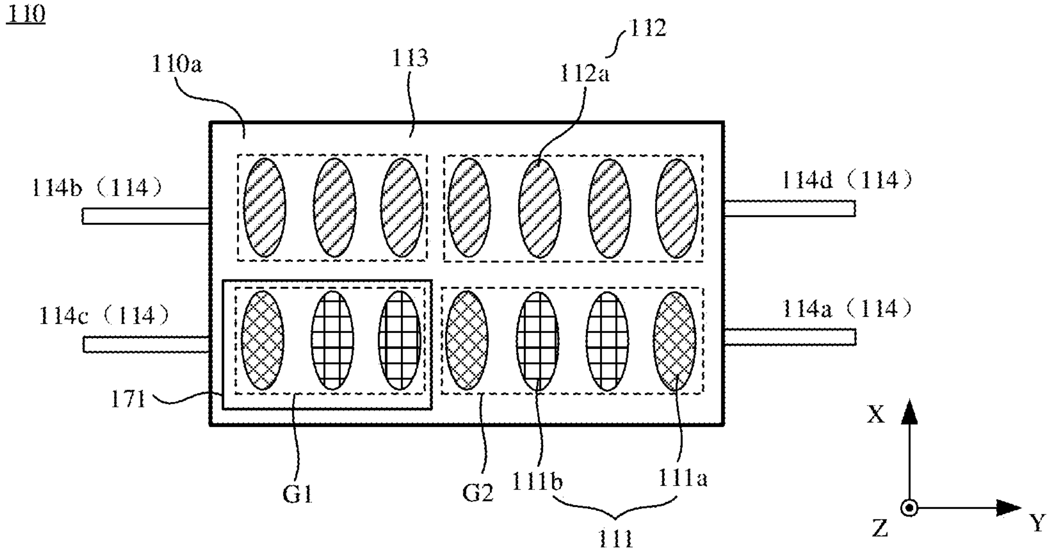
FIG. 21 is a structural diagram of a laser array and a first polarization angle conversion unit in the light source shown in FIG. 20.

For this purpose, some embodiments of the present disclosure provide a light source. FIG. 20 is a structural diagram of still yet another light source according to some embodiments, and FIG. 21 is a structural diagram of a laser array and a first polarization angle conversion unit in the light source shown in FIG. 20. Referring to FIG. 20 and FIG. 21, in some embodiments, in order to solve the above problems, the light source 10 further includes a first polarization angle conversion unit 171.

In the light source 10, the first row of laser chips 111 includes at least two first-color laser chips 111*a*. The first row of laser chips 111 includes a first laser chip group G1 and a second laser chip group G2. The first laser chip group G1 includes at least one first-color laser chip 111*a*, and the second laser chip group G2 includes at least one first-color laser chip 111*a*. It may also be said that both the first laser chip group G1 and the second laser chip group G2 include at least one first-color laser chip 111*a*.

It should be noted that, referring to the above description, the first-color laser chip 111*a* is a blue laser chip, but not limited thereto, and the first-color laser chip 111*a* may also be a green laser chip.

The first polarization angle conversion unit 171 is disposed between the first laser chip group G1 and the light combining mirror group 120 along the extending direction of a light path of the light beam emitted by the first laser chip group G1. Exemplarily, on the light exit surface 110*a* of the laser array 110, the orthogonal projection of the first laser chip group G1 is disposed within the orthogonal projection of the first polarization angle conversion unit 171. In this way, the laser beams emitted by respective laser chips in the first laser chip group G1 can be incident to the light combining mirror group 120 through the first polarization angle conversion unit 171.

The first polarization angle conversion unit 171 may be configured to change the polarization direction of the laser beam incident to the first polarization angle conversion unit 171.

With reference to the above description, due to different luminescent mechanisms of the luminescent materials in the laser chips of different colors, the red laser chip oscillates in different directions from the blue laser chip and the green laser chip in the luminescent process, so that the polarization direction of the red laser beam is different from that of the blue laser beam, and also different from that of the green laser beam. Exemplarily, the red laser beam may be P polarized light, and the blue laser beam and the green laser beam may be S polarized light. The polarization directions of P polarized light and S polarized light are perpendicular.

Based on the above, and with continued reference to FIG. 20 and FIG. 21, the first polarization angle conversion unit 171 can receive the laser beams emitted by the laser chips in the first laser chip group G1 and change the polarization direction of the laser beams. For example, the polarization direction of the laser beam is rotated by 90 degrees. In this way, the first color laser beam emitted by at least one first-color laser chip 111*a* in the first laser chip group G1 can pass through the first polarization angle conversion unit 171 and then enter the light combining mirror group 120, and compared with the first color laser beam emitted by at least one first-color laser chip 111*a* in the second laser chip group G2 and directly entering the light combining mirror group 120, the first color laser beam emitted by at least one first-color laser chip 111*a* in the first laser chip group G1 In this way, the first color laser beam incident to the light combining mirror group 120 can have two polarization directions, which can reduce the coherence of the first color laser beam, thus improving the speckle phenomenon of the beam emitted by the laser projection device.

With continued reference to FIG. 20 and FIG. 21, in some embodiments, the first row of laser chips 111 includes at least two second-color laser chips 111*b*. The first laser chip group G1 further includes at least one second-color laser chip 111*b*, and the second laser chip group G2 further includes at least one second-color laser chip 111*b*. It may also be said that both the first laser chip group G1 and the second laser chip group G2 include at least one second-color laser chip 111*b*.

Since the first polarization angle conversion unit 171 is disposed between the first laser chip group G1 and the light combining mirror group 120, the second color laser beams emitted by the second-color laser chips 111*b* in the first laser chip group G1 can enter the light combining mirror group 120 through the first polarization angle conversion unit 171. In this way, similar to the first color laser beam, the second color laser beam incident to the light combining mirror group 120 may also have two polarization directions, thus reducing the coherence of the second color laser beam and further improving the speckle effect of the beam emitted by the laser projection device.

The second-color laser chip 111*b* may be a blue laser chip or a green laser chip, and the color of the laser beam emitted by the second-color laser chip 111*b* is different from the color of the laser beam emitted by the first-color laser chip 111*a*. Exemplarily, the first-color laser chip 111*a* is a blue laser chip and the second-color laser chip 111*b* is a green laser chip. Further exemplarily, the first-color laser chip 111*a* is a green laser chip and the second-color laser chip 111*b* is a blue laser chip.

Figure 22:
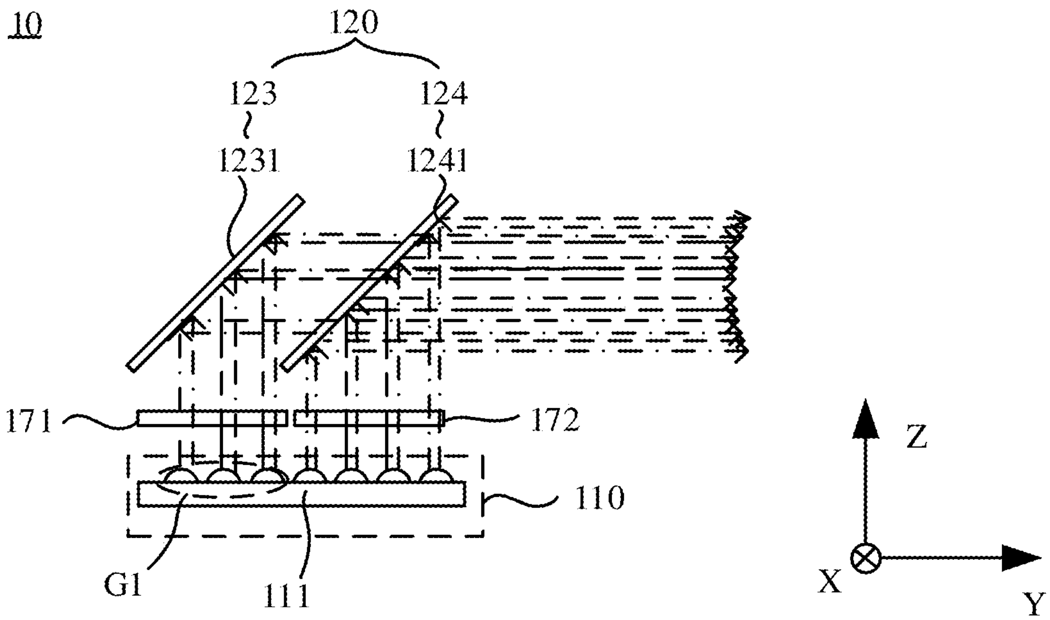
FIG. 22 is a structural diagram of a light source according to some embodiments.
Figure 23:
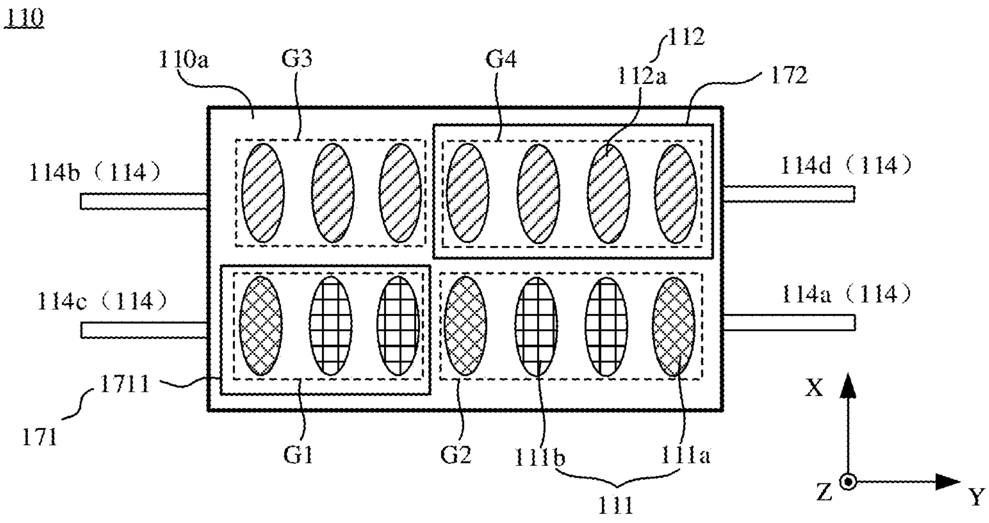
FIG. 23 is a schematic structural diagram of a laser array, a first polarization angle conversion unit and a second polarization angle conversion unit in the light source shown in FIG. 22.

FIG. 22 is a structural diagram of another light source according to some embodiments, and FIG. 23 is a structural schematic diagram of a laser array, a first polarization angle conversion unit and a second polarization angle conversion unit in the light source shown in FIG. 22. Referring to FIG. 22 and FIG. 23, in some embodiments, the light source 10 further includes a second polarization angle conversion unit 172. The second polarization angle conversion unit 172 is disposed between a part of the red laser chips 112*a* in the second row of laser chips 112 and the light combining mirror group 120 along the extending direction of a light path of the beams emitted by the second row of laser chips. Exemplarily, on the light exit surface 110*a* of the laser array 110, the orthographic projection of a part of the red laser chips 112*a* in the second row of laser chips 112 is disposed within the orthographic projection of the second polarization angle conversion unit 172. In this way, the red laser beam emitted by the red laser chip 112*a* in the second laser chip group G1 can enter the light combining mirror group 120 through the second polarization angle conversion unit 172.

Similar to the first polarization angle conversion unit 171, the second polarization angle conversion unit 172 may be configured to change the polarization direction of the laser beam incident to the second polarization angle conversion unit 172. For example, the second polarization angle conversion unit 172 may receive the red laser beam exiting the red laser chip 112*a* in the second row of laser chips 112, and change the polarization direction of the laser beam. For example, the polarization direction of the laser beam is rotated by 90 degrees. In this way, similar to the first color laser beam or the second color laser beam, the red laser beam incident to the light combining mirror group 120 can have two polarization directions, which can make the coherence of the red laser beam lower and improve the speckle phenomenon of the beam emitted by the laser projection device.

It should be noted that, referring to FIG. 23, the present disclosure does not limit the quantity of laser chips included in the first laser chip group G1. Exemplarily, the first laser chip group G1 includes three laser chips. Alternatively, the first laser chip group G1 includes four laser chips. Similarly, the present disclosure does not limit the quantity of red laser chips corresponding to the second polarization angle conversion unit 172. Exemplarily, the quantity of red laser chips in this part is three. Or, the quantity of red laser chips in this part is four.

It should be noted that in some embodiments, the light source 10 includes a first polarization angle conversion unit, but does not include a second polarization angle conversion unit. In other embodiments, the light source 10 includes the second polarization angle conversion unit, but does not include the first polarization angle conversion unit. In still other embodiments, referring to FIG. 22 and FIG. 23, the light source 10 includes both a first polarization angle conversion unit 171 and a second polarization angle conversion unit 172. In this case, in the light source 10, the first color laser beam, the second color laser beam and the red laser beam received by the light combining mirror group 120 can all have two polarization directions, so that the coherence of the laser beams of the same color is low, and the speckle phenomenon of the beams emitted by the laser projection device can be further improved.

Referring to FIG. 22 and FIG. 23, in some embodiments, the light source 10 includes a first polarization angle conversion unit 171 and a second polarization angle conversion unit 172. The polarization direction of laser beams emitted by the first-color laser chip 111*a* and the second-color laser chip 111*b* may be a first polarization direction, and the polarization direction of laser beams emitted by the red laser chip 112*a* may be a second polarization direction. The first polarization angle conversion unit 171 may be configured to convert a laser beam with a first polarization direction into a laser beam with a second polarization direction, and the second deflection angle conversion unit 172 may be configured to convert a laser beam with a second polarization direction into a laser beam with the first polarization direction.

Exemplarily, the first-color laser chip 111*a* is a blue laser chip, the second-color laser chip 111*b* is a green laser chip, and both the blue laser beam and the green laser beam are the S polarized light of the first polarization direction. The red laser beam is the P polarized light of the second polarization direction. In this case, the first polarization direction may be perpendicular to the second polarization direction. In some embodiments, both the first polarization angle conversion unit 171 and the second polarization angle conversion unit 172 may be half-wave plates, and the half-wave plates may rotate the polarization directions of the laser beams incident thereto by 90 degrees. In this way, a part of the red laser beam received by the light combining mirror group 120 may have the first polarization direction, and the other part may have a second polarization direction. In both the first color laser beam and the second color laser beam received by the light combining mirror group 120, a part of the laser beams has the first polarization direction, and the other part of the laser beams has the second polarization direction. In this way, the coherence of the red laser beam, the first color laser beam and the second color laser beam in the light source 10 can be smaller, thereby improving the speckle effect of the beam emitted by the laser projection device. In addition, each of the three-color laser beams received by the light combining mirror group 120 has two different polarization directions, and the two different polarization directions are the first polarization direction and the second polarization direction. In this way, the polarization properties of the three laser beams in the light source 10 are relatively uniform, which facilitates the regulation of the three laser beams and simplifies the structure of the light source.

Referring to FIG. 22 and FIG. 23, in some embodiments, the second row of laser chips 112 includes a first red laser chip group G3 and a second red laser chip group G4. The first red laser chip group G3 includes at least one red laser chip 112*a*, and the second red laser chip group G4 includes at least one red laser chip 112*a*. In some embodiments, the first red laser chip group G3 includes a plurality of red laser chips 112*a*, and the plurality of red laser chips 112*a* are continuously arranged. Similarly, in some embodiments, the second red laser chip group G3 includes a plurality of red laser chips 112*a*, and the plurality of red laser chips 112*a* are continuously arranged.

The second polarization angle conversion unit 172 is disposed between the second red laser chip group G4 and the light combining mirror group 120. In this way, the red laser beams emitted by respective red laser chips 112*a* in the second red laser chip group G4 can be incident to the light combining mirror group 120 through the second polarization angle conversion unit 172.

It should be noted that although FIG. 22 and FIG. 23 illustrate, for example, that the first polarization angle conversion unit 171 is disposed between the first laser chip group G1 and the light combining mirror group 120, and the second polarization angle conversion unit 172 is disposed between the second red laser chip group G4 and the light combining mirror group 120, the first polarization angle conversion unit 171 and the second polarization angle conversion unit 172 need not be disposed on the same diagonal of the rectangular light exit surface 110*a*. For example, in another example, the second polarization angle conversion unit 172 is disposed between the first red laser chip group G3 and the light combining mirror group 120. In another example, the first polarization angle conversion unit 171 is disposed on a diagonal of the second red laser chip group G4, the second polarization angle conversion unit 172 is disposed between the light combining mirror group 120 and a combination of the first red laser chip group G3 and the second red laser chip group G4. The embodiments of the present disclosure are not limited to the above examples.

In some embodiments, the first laser chip group G1 and the first red laser chip group G3 are arranged in a column in the laser array 110, and the second laser chip group G2 and the second red laser chip group G4 are arranged in a column in the laser array 110. Exemplarily, the first laser chip group G1 and the first red laser chip group G3 are arranged in a column along the first direction X in the laser array 110, and the second laser chip group G2 and the second red laser chip group G4 are arranged in a column along the first direction X in the laser array 110.

Figure 24:
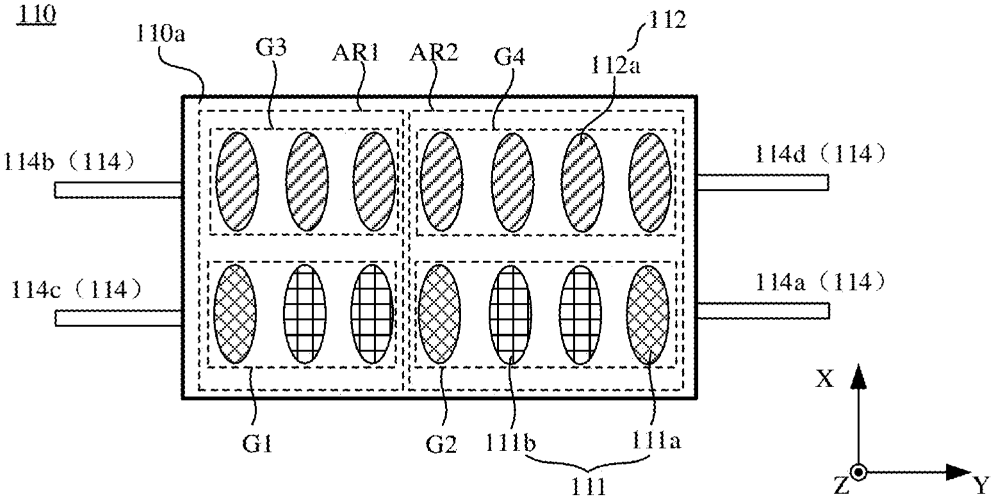
FIG. 24 is a structural diagram of a laser array according to some embodiments.

FIG. 24 is a structural diagram of a laser array. Referring to FIG. 23 and FIG. 24, the first laser chip group G1 and the first red laser chip group G3 are arranged in a column in the laser array 110, and the second laser chip group G2 and the second red laser chip group G4 are arranged in a column in the laser array 110. Therefore, the laser array 110 may have a first region AR1 and a second region AR2, the first laser chip group G1 and the first red laser chip group G3 which are arranged in a column are disposed in the first area AR1, and the second laser chip group G2 and the second red laser chip group G2 which are arranged in a column are disposed in the second region AR2.

The laser beam emitted by the first laser chip group G1 has the first polarization direction, the laser beam may have the second polarization direction after passing through the first polarization angle conversion unit 171, and the laser beam emitted by the first red laser chip group G3 has the second polarization direction. Therefore, all the laser beams exiting the first region AR1 can have the second polarization direction. Similarly, the laser beam emitted by the second laser chip group G2 has the first polarization direction, the laser beam emitted by the second red laser chip group G4 has the second polarization direction, and the laser beam can have the first polarization direction after passing through the second polarization angle conversion unit 172. Therefore, all the laser beams exiting the second area AR2 can have the first polarization direction. In this way, the polarization properties of the three types of laser beams in the light source 10 are relatively uniform, and the distribution is relatively regular, which facilitates adjustment and regulation on the three types of laser beams and simplifies the structure of the light source.

Referring to FIG. 22 and FIG. 23, in some embodiments, the light combining mirror group 120 includes a third light combining unit 123 and a fourth light combining unit 124. The third light combining unit 123 is configured to receive the light beam emitted by the first laser chip group G1 and passing through the first polarization angle conversion unit 171, and is configured to receive the light beam emitted by the first red laser chip group G3. In this way, the third light combining unit 123 can be configured to receive the first color laser beam, the second color laser beam and the red laser beam with the second polarization direction.

The fourth light combining unit 124 is configured to receive the light beam emitted by the second laser chip group G2 and is configured to receive the light beam emitted by the second red laser chip group G4 and passing through the second polarization angle conversion unit 172. In this way, the fourth light combining unit 124 can be configured to receive the first color laser beam, the second color laser beam and the red laser beam with the first polarization direction.

The third light combining unit 123 and the fourth light combining unit 124 may combine the respectively received laser beams, which enables the laser beam of a first polarization state and the laser beam of a second polarization state to be uniformly mixed into a mixed beam, so that the coherence of the laser beam exiting the combining lens group 120 is lower, the speckle effect of the light beam emitted by the laser projection device can be improved, and the projection effect of the laser projection device is improved.

Referring to FIG. 22, in some embodiments, an arrangement direction of the third light combining unit 123 and the fourth light combining unit 124 is parallel to the row direction of the first row of laser chips 111 or the second row of laser chips 112. In some embodiments, the row direction of the first row of laser chips 111 is parallel to the row direction of the second row of laser chips 112. In this case, the arrangement direction of the third light combining unit 123 and the fourth light combining unit 124, the row direction of the first row of laser chips 111 and the row direction of the second row of laser chips 112 are parallel to each other, for example, parallel to the second direction Y.

With the above arrangement, the purpose that the third light combining unit 123 and the fourth light combining unit

124 combine two types of laser beams with the same color but different polarization directions emitted by the same row of laser chips can be realized, the light path of the light combining mirror group can be simpler, and the structure of the light source can also be simpler.

In some embodiments, the third light combining unit 123 includes a third reflective mirror 1231, and the fourth light combining unit 124 includes a polarization beam splitter 1241. The third reflective mirror 1231 is configured to reflect the received light beam towards the polarization beam splitter 1241. The polarization beam splitter 1241 is configured to transmit the light beam reflected by the third reflective mirror 1231, and is also configured to reflect the light beam transmitted through the second polarization angle conversion unit 172 and the light beam emitted by the second laser chip group G2.

The polarization beam splitter 1241 may allow the incident polarized light of the second polarization direction to completely pass through and reflect the incident polarized light of the first polarization direction. In this way, the polarization beam splitter 1241 can combine the received laser beam of the first polarization state and the received laser beam of the second polarization state and then guide to subsequent optical elements, so that the laser beam of the first polarization state and the laser beam of the second polarization state can be uniformly mixed into a mixed beam, and the coherence of the mixed beam can be lower.

Referring to FIG. 23, in some embodiments, the first polarization angle conversion unit 171 includes first wave plates 1711. The first wave plates 1711 are configured to receive the light beam (i.e., the first color laser beam) emitted by at least one first-color laser chip 111*a* included in the first laser chip group G1 and the light beam (i.e., the second color laser beam) emitted by at least one second-color laser chip 111*b* included in the first laser chip group G1. In this way, each first-color laser chip 111*a* and each second-color laser chip 111*b* in the first laser chip group G1 can correspond to one first wave plate 1711, so that the structure of the first polarization angle conversion unit 171 can be simpler.

In some embodiments, the first wave plates 1711 may be configured according to one of two wavelengths corresponding to the first color laser beam and the second color laser beam. In some other possible implementations, the first wave plates 1711 may be configured according to a middle value of two wavelengths corresponding to the first color laser beam and the second color laser beam.

Figure 25:
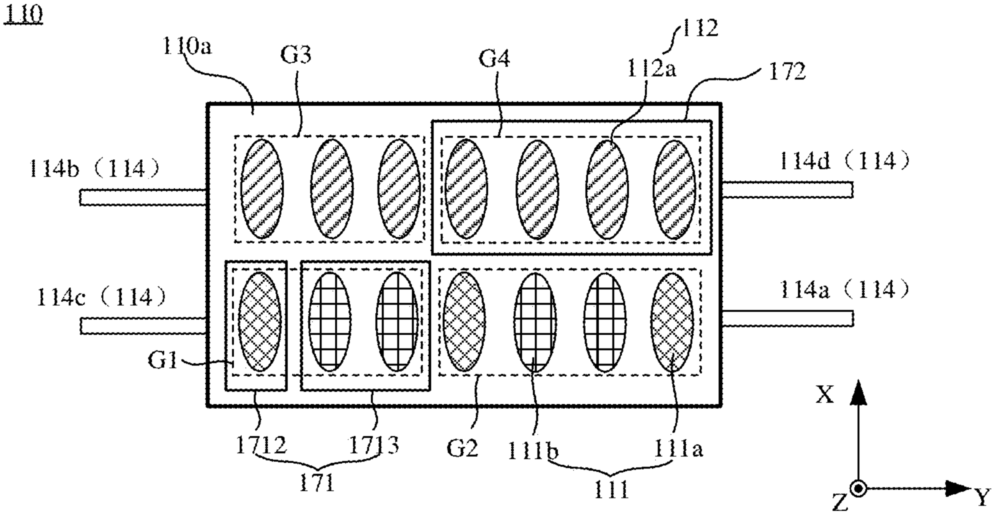
FIG. 25 is a structural diagram of a laser array, a first polarization angle conversion unit and a second polarization angle conversion unit according to some embodiments.

FIG. 25 is a structural diagram of a laser array, a first polarization angle conversion unit and a second polarization angle conversion unit. Referring to FIG. 25, in some embodiments, the first polarization angle conversion unit 171 includes second wave plates 1712 and third wave plates 1713. The second wave plates 1712 are configured to receive the light beam (i.e., the first color laser beam) emitted by at least one first-color laser chip 111*a* included in the first laser chip group G1. The third wave plates 1713 are configured to receive the light beam (i.e., the second color laser beam) emitted by at least one second-color laser chip 111*b* included in the first laser chip group G1. In this way, the second wave plates 1712 can be configured according to the wavelength of the first color laser beam, and the third wave plates 1713 can be configured according to the wavelength of the second color laser beam, so that after the first color laser beam and the second color laser beam pass through the second wave plates 1712 and the third wave plates 1713 respectively, the polarization polarities of the light beams are changed by 90 degrees.

Figure 26:
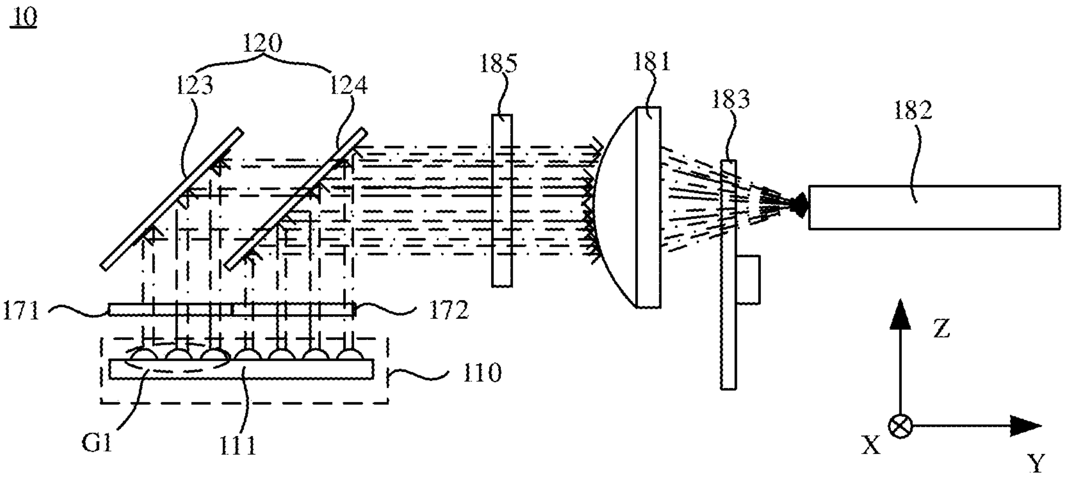
FIG. 26 is a structural diagram of still yet another light source according to some embodiments.

FIG. 26 is a structural diagram of still yet another light source according to some embodiments. Referring to FIG. 26, in some embodiments, the light source 10 further includes a diffusion sheet assembly 187, the beam reducing lens 181, the speckle dissipating component 183 and the second light homogenizing component 182. Along the extending direction of a light path of the light beam emitted by the combining lens group 120, the diffusion sheet assembly 187, the beam reducing lens 181, the speckle dissipating component 183 and the second light homogenizing component 182 may be arranged in sequence.

Figure 27:
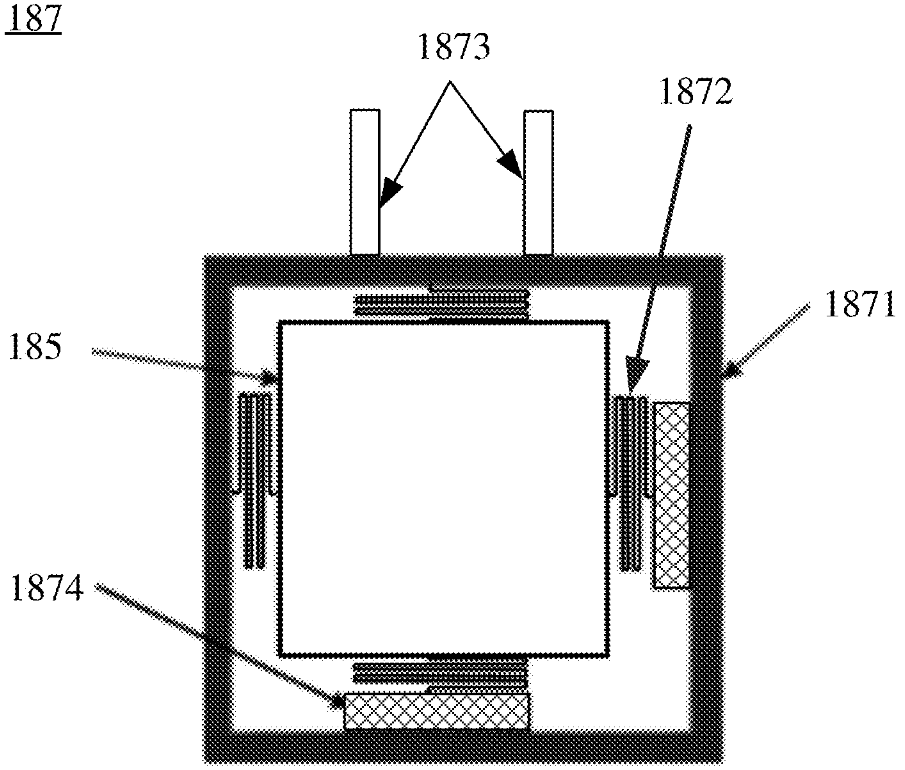
FIG. 27 is a structural diagram of a diffusion sheet assembly according to some embodiments.

FIG. 27 is a structural diagram of a diffusion sheet assembly. Referring to FIG. 27, in some embodiments, the diffusion sheet assembly 187 is a vibrating diffusion sheet assembly. The diffusion sheet assembly 187 includes a bracket 1871, a plurality of vibration conductive structures 1872, a first electrode 1873, a second electrode 1874 and a diffusion sheet 185. The bracket 1871 is fixedly connected to one side of the plurality of vibration conductive structures 1872, and the other side of the plurality of vibration conductive structures 1872 is fixedly connected to the diffusion sheet 185. The first electrode 1873 and the second electrode 1874 and two vibration conductive structures 1872 in the plurality of vibration conductive structures 1872 may be electrically connected. One vibration conductive structure 1872 (e.g., each vibration conductive structure) may conduct vibration to the diffusion sheet 185 under electric drive, so that the diffusion sheet 185 vibrates. In this way, the diffusion sheet assembly 187 can play a better role in speckle dissipation. In some embodiments, the diffusion sheet assembly 187 may also be one diffusion sheet. For example, the diffusion sheet assembly 187 is the diffusion sheet 185.

The description of the beam reducing lens 181, the speckle dissipating component 183 and the second light homogenizing component 182 may refer to the above description, and will not be repeated here.

The foregoing is only the specific implementations of the present disclosure, but the protection scope of the present disclosure is not limited thereto. Changes or substitutions conceivable by any person skilled familiar with the technical field within the technical scope disclosed in the present disclosure, as well as the combinations of various features made without conflict, should be included in the protection scope of the present disclosure. Therefore, the scope of protection of the present disclosure should be based on the scope of protection of the claims.

The invention claimed is:

1. A light source comprising:

a laser array comprising a first row of laser chips and a second row of laser chips, wherein the first row of laser chips comprises at least one first-color laser chip and at least one second-color laser chip, and the second row of laser chips comprises at least two red laser chips;

a light combining mirror group configured to combine laser beams emitted by the laser array; and a light spot shaping component configured to receive and adjust a light beam coming from the light combining mirror group, so that a difference between a length of a light spot of a light beam exiting the light spot shaping component in a long side direction of the light spot and a length of the light spot in a short side direction of the light spot is less than a difference between a length of a light spot of a light beam incident on the light spot shaping component in a long side direction of the light spot of the light beam incident on the light spot shaping component and a length of the light spot of the light beam incident on the light spot shaping component in a short side direction of the light spot of the light beam incident on the light spot shaping component.

2. The light source according to claim 1, wherein, the light spot shaping component comprises a light pipe, and the light pipe is configured to receive and adjust the light beam coming from the light combining mirror group, so that an absolute value of a difference between an exit angle corresponding to a short side of a light spot of a light beam exiting the light pipe and an exit angle corresponding to a long side of the light spot of the light beam exiting the light pipe is less than an absolute value of a difference between an exit angle corresponding to a short side of a light spot of a light beam incident on the light pipe and an exit angle corresponding to a long side of the light spot of the light beam incident on the light pipe.

3. The light source according to claim 2, wherein, an arrangement direction of the laser array and the light combining mirror group is perpendicular or parallel to an arrangement direction of the light combining mirror group and the light pipe.

4. The light source according to claim 1, wherein, the light spot shaping component comprises a shaping lens group, the shaping lens group comprises a first cylindrical lens and a second cylindrical lens, and the first cylindrical lens is configured to receive the light beam coming from the light combining mirror group and guide the light beam coming from the light combining mirror group to the second cylindrical lens.

5. The light source according to claim 4, wherein, the first cylindrical lens is a plano-convex cylindrical lens, the second cylindrical lens is a plano-concave cylindrical lens or a plano-convex cylindrical lens, a generatrix of a cylindrical surface of the first cylindrical lens is parallel to a generatrix of a cylindrical surface of the second cylindrical lens, and a focal point of the second cylindrical lens coincides with a focal point of the first cylindrical lens.

6. The light source according to claim 5, wherein, the light spot of the light beam coming from the light combining mirror group is a rectangular light spot, and a long side of the rectangular light spot is perpendicular to the generatrix of the cylindrical surface of the first cylindrical lens.

7. The light source according to claim 4, further comprising:

a second reflective mirror, wherein the first cylindrical lens, the second reflective mirror, and the second cylindrical lens are sequentially disposed along an extending direction of a light path.

8. The light source according to claim 1, wherein, the light combining mirror group comprises a first light combining unit and a second light combining unit, the first light combining unit is configured to receive light beams emitted by the first row of laser chips, the second light combining unit is configured to receive light beams emitted by the second row of laser chips, and an arrangement direction of the first light combining unit and the second light combining unit is parallel to an arrangement direction of the first row of laser chips and the second row of laser chips.

9. The light source according to claim 8, wherein, the first light combining unit comprises a first reflective mirror, and the second light combining unit comprises a dichroic mirror;

the first reflective mirror is configured to receive laser beams emitted by the first row of laser chips and reflect the laser beams emitted by the first row of laser chips towards the dichroic mirror; and the dichroic mirror is configured to receive and reflect laser beams emitted by the second row of laser chips and transmit the laser beams emitted by the first row of laser chips; or, the dichroic mirror is configured to receive and transmit the laser beams emitted by the second row of laser chips and reflect the laser beams emitted by the first row of laser chips.

10. The light source according to claim 1, wherein, the first row of laser chips comprises at least two first-color laser chips;

the first row of laser chips further comprises a first laser chip group and a second laser chip group, the first laser chip group comprising at least one first-color laser chip and the second laser chip group comprising at least one first-color laser chip; and the light source further comprises:

a first polarization angle conversion unit disposed between the first laser chip group and the light combining mirror group along an extending direction of a light path of a light beam emitted by the first laser chip group.

11. The light source according to claim 10, wherein, the first row of laser chips comprises at least two second-color laser chips; and the first laser chip group further comprises at least one second-color laser chip, and the second laser chip group further comprises at least one second-color laser chip.

12. The light source according to claim 11, further comprising:

a second polarization angle conversion unit disposed between a part of the at least two red laser chips in the second row of laser chips and the light combining mirror group along an extending direction of a light path of light beams emitted by the second row of laser chips.

13. The light source according to claim 12, wherein, a polarization of laser beams emitted by the first-color laser chip and the second-color laser chip is in a first polarization direction, a polarization of laser beams emitted by the red laser chips is in a second polarization direction, the first polarization angle conversion unit is configured to convert laser beams with the first polarization direction into laser beams with the second polarization direction, and the second polarization angle conversion unit is configured to convert laser beams with the second polarization direction into laser beams with the first polarization direction;

the second row of laser chips comprises a first red laser chip group and a second red laser chip group, the first red laser chip group comprises at least one red laser chip, the second red laser chip group comprises at least one red laser chip, and the second polarization angle conversion unit is disposed between the second red laser chip group and the light combining mirror group along an extending direction of a light path of a light beam emitted by the second red laser chip group; and the first laser chip group and the first red laser chip group are arranged in one column in the laser array, and the second laser chip group and the second red laser chip group are arranged in another column in the laser array.

14. The light source according to claim 13, wherein, the light combining mirror group comprises a third light combining unit and a fourth light combining unit, the third light combining unit is configured to receive a light beam emitted by the first laser chip group and passing through the first polarization angle conversion unit, and a light beam emitted by the first red laser chip group; and the fourth light combining unit is configured to receive a light beam emitted by the second laser chip group and a light beam emitted by the second red laser chip group and passing through the second polarization angle conversion unit; and an arrangement direction of the third light combining unit and the fourth light combining unit is parallel to a row direction of the first row of laser chips or the second row of laser chips.

15. The light source according to claim 1, wherein, the first-color laser chip is a blue laser chip, and the second-color laser chip is a green laser chip; and at least one first-color laser chip is disposed at an edge of the first row of laser chips in a row direction of the first row of laser chips, and a quantity of the second-color laser chips in the first row of laser chips is greater than a quantity of the first-color laser chips in the first row of laser chips.

16. A laser projection device comprising:

a light source;

a light modulating component configured to modulate a light beam incident on the light modulating component according to an image signal; and a lens configured to project a light beam incident on the lens to form a projection picture;

wherein the light source is configured to provide the light beam incident on the light modulating component, and the light source comprises:

a laser array comprising a first row of laser chips and a second row of laser chips, wherein the first row of laser chips comprises at least one first-color laser chip and at least one second-color laser chip, and the second row of laser chips comprises at least two red laser chips;

a light combining mirror group configured to combine laser beams emitted by the laser array; and a light spot shaping component configured to receive and adjust a light beam coming from the light combining mirror group, so that a difference between a length of a light spot of a light beam exiting the light spot shaping component in a long side direction of the light spot and a length of the light spot in a short side direction of the light spot is less than a difference between a length of a light spot of a light beam incident on the light spot shaping component in a long side direction of the light spot of the light beam incident on the light spot shaping component and a length of the light spot of the light beam incident on the light spot shaping component in a short side direction of the light spot of the light beam incident on the light spot shaping component.

17. The laser projection device according to claim 16, wherein, the light spot shaping component comprises a light pipe, and the light pipe is configured to receive and adjust the light beam coming from the light combining mirror group, so that an absolute value of a difference between an exit angle corresponding to a short side of a light spot of a light beam exiting the light pipe and an exit angle corresponding to a long side of the light spot of the light beam exiting the light pipe is less than an absolute value of a difference between an exit angle corresponding to a short side of a light spot of a light beam incident on the light pipe and an exit angle corresponding to a long side of the light spot of the light beam incident on the light pipe; and an arrangement direction of the laser array and the light combining mirror group is perpendicular or parallel to an arrangement direction of the light combining mirror group and the light pipe.

18. The laser projection device according to claim 16, wherein, the light combining mirror group comprises a first light combining unit and a second light combining unit, the first light combining unit is configured to receive light beams emitted by the first row of laser chips, the second light combining unit is configured to receive light beams emitted by the second row of laser chips, and an arrangement direction of the first light combining unit and the second light combining unit is parallel to an arrangement direction of the first row of laser chips and the second row of laser chips;

the first light combining unit comprises a first reflective mirror, and the second light combining unit comprises a dichroic mirror;

the first reflective mirror is configured to receive laser beams emitted by the first row of laser chips and reflect the laser beams emitted by the first row of laser chips towards the dichroic mirror; and the dichroic mirror is configured to receive and reflect laser beams emitted by the second row of laser chips and transmit the laser beams emitted by the first row of laser chips; or, the dichroic mirror is configured to receive and transmit the laser beams emitted by the second row of laser chips and reflect the laser beams emitted by the first row of laser chips.

19. The laser projection device according to claim 16, wherein, the first row of laser chips comprises at least two first-color laser chips and at least two second-color laser chips;

the first row of laser chips comprises a first laser chip group and a second laser chip group, the first laser chip group comprising at least one first-color laser chip and at least one second-color laser chip, and the second laser chip group comprising at least one first-color laser chip and at least one second-color laser chip; and the light source further comprises:

a first polarization angle conversion unit disposed between the first laser chip group and the light combining mirror group along an extending direction of a light path of a light beam emitted by the first laser chip group.

20. The laser projection device according to claim 19, wherein the light source further comprises a second polarization angle conversion unit disposed between a part of the at least two red laser chips in the second row of laser chips and the light combining mirror group along an extending direction of a light path of light beams emitted by the second row of laser chips;

a polarization of laser beams emitted by the first-color laser chip and the second-color laser chip is in a first polarization direction, a polarization of laser beams emitted by the red laser chips is in a second polarization direction, the first polarization angle conversion unit is configured to convert laser beams with the first polarization direction into laser beams with the second polarization direction, and the second polarization angle conversion unit is configured to convert laser beams with the second polarization direction into laser beams with the first polarization direction;

the second row of laser chips comprises a first red laser chip group and a second red laser chip group, the first red laser chip group comprises at least one red laser chip, the second red laser chip group comprises at least one red laser chip, and the second polarization angle conversion unit is disposed between the second red laser chip group and the light combining mirror group along an extending direction of a light path of a light beam emitted by the second red laser chip group; and the first laser chip group and the first red laser chip group are arranged in one column in the laser array, and the second laser chip group and the second red laser chip group are arranged in another column in the laser array.

* * * * *